(12) United States Patent
Hildebrandt et al.

(10) Patent No.: US 12,185,626 B2
(45) Date of Patent: Dec. 31, 2024

(54) CHEMICAL COMPOUNDS, OPTOELECTRONIC ELEMENTS COMPRISING AT LEAST ONE NEW CHEMICAL COMPOUND, AND USE OF NEW CHEMICAL COMPOUNDS IN AN OPTOELECTRONIC ELEMENT

(71) Applicant: HELIATEK GMBH, Dresden (DE)

(72) Inventors: Dirk Hildebrandt, Ulm (DE); Antoine Mirloup, Ulm (DE); Andre Weiss, Dresden (DE)

(73) Assignee: HELIATEK GMBH, Dresden (DE)

( * ) Notice: Subject to any disclaimer, the term of this patent is extended or adjusted under 35 U.S.C. 154(b) by 84 days.

(21) Appl. No.: 17/916,065

(22) PCT Filed: Mar. 31, 2021

(86) PCT No.: PCT/EP2021/058534
§ 371 (c)(1),
(2) Date: Sep. 30, 2022

(87) PCT Pub. No.: WO2021/198388
PCT Pub. Date: Oct. 7, 2021

(65) Prior Publication Data
US 2023/0165146 A1  May 25, 2023

(30) Foreign Application Priority Data

Mar. 31, 2020 (EP) .................................. 20167382

(51) Int. Cl.
| | |
|---|---|
| H10K 85/60 | (2023.01) |
| C07F 5/02 | (2006.01) |
| C09K 11/06 | (2006.01) |
| H10K 30/30 | (2023.01) |

(52) U.S. Cl.
CPC ........... *H10K 85/658* (2023.02); *C07F 5/027* (2013.01); *C09K 11/06* (2013.01); *C09K 2211/1018* (2013.01); *H10K 30/30* (2023.02)

(58) Field of Classification Search
CPC .................................................. H10K 85/658
USPC .......................................................... 540/4
See application file for complete search history.

(56) References Cited

U.S. PATENT DOCUMENTS

| | | |
|---|---|---|
| 7,825,326 B2 | 11/2010 | Koppe |
| 10,868,255 B2 | 12/2020 | Hildebrandt et al. |
| 10,950,811 B2 | 3/2021 | Walzer et al. |
| 11,063,222 B2 | 7/2021 | Hildebrandt et al. |
| 2007/0090371 A1 | 4/2007 | Drechsel et al. |
| 2012/0126213 A1 | 5/2012 | Gresser et al. |
| 2013/0104968 A1 | 5/2013 | Pfeiffer et al. |
| 2013/0160829 A1 | 6/2013 | Uhrich et al. |

(Continued)

FOREIGN PATENT DOCUMENTS

| | | |
|---|---|---|
| DE | 19957001 A1 | 5/2001 |
| EP | 2385556 A1 | 11/2011 |
| WO | WO 2004083958 A2 | 9/2004 |
| WO | WO 2010133208 A1 | 11/2010 |
| WO | WO 2011161108 A1 | 12/2011 |
| WO | WO 2014128278 A1 | 8/2014 |
| WO | WO 2014206860 A1 | 12/2014 |

(Continued)

OTHER PUBLICATIONS

King, Med. Chem, Principle and Practice (1994) 206-208.*

(Continued)

*Primary Examiner* — Taofiq A Solola
(74) *Attorney, Agent, or Firm* — LEYDIG, VOIT & MAYER, LTD.

(57) ABSTRACT

Compounds of formula (Ia) and/or formula (Ib), are disclosed wherein R1 and R3 are independently selected from the group consisting of H, halogen, alkyl, fluorinated or partly fluorinated alkyl, and heteroaryl, R2 is selected from the group consisting of halogen, fluorinated and partly fluorinated alkyl, R4 and R5 are independently selected from the group consisting of halogen, alkyl, fluorinated or partly fluorinated alkyl, alkenyl, alkinyl, alkoxy, aryl, and heteroaryl, Z is independently selected from the group consisting of $CH_2$, CHR6 or CR7R8, with R6, R7 and R8 independently selected from the group consisting of H, halogen, alkyl, alkoxy, aryl, and heteroaryl, wherein n is independently 1, 2 or 3, U, V and W of formula (Ia) independently form an aryl ring or a heteroaryl ring, and T, U, V and W of formula (Ib) form an aryl ring or a heteroaryl ring.

15 Claims, 5 Drawing Sheets

(56) References Cited

U.S. PATENT DOCUMENTS

2016/0141497 A1 5/2016 Weiss et al.

FOREIGN PATENT DOCUMENTS

| WO | WO 2015036529 A1 | 3/2015 |
| WO | WO 2017114937 A1 | 7/2017 |
| WO | WO 2017114938 A1 | 7/2017 |
| WO | WO 2017125525 A1 | 7/2017 |

OTHER PUBLICATIONS

Gao et al., Chem—A EU. J. (2009), vol. 25(48) pp. 11246-11256. Abstract.*

Gao et al., Chem—A EU. J. (2009), vol. 25(48) pp. 11246-11256.*

Xin-Dong Jiang et al., "Synthesis of meso-CF3-Substituted BODIPY Compounds with Redshifted Absorption", European Journal of Organic Chemistry, Sep. 15, 2017, pp. 5074-5079, XP 55552332, vol. 2017, No. 34, Wiley-VCH Verlag GmbH, Weinheim, Germany.

Noel Boens et al., "Visible Absorption and Fluorescence Spectroscopy of Conformationally Constrained, Annulated BODIPY Dyes", The Journal of Physical Chemistry, Sep. 21, 2012, pp. 9621-9631, XP 55726176, vol. 116, No. 39, ACS Publications American Chemical Society, Washington, D.C., U.S.

Jia-Nan Wang et al., "An Accurate and Efficient Method to Predict the Electronic Excitation Energies of BODIPY Fluorescent Dyes", Journal of Computational Chemistry, Nov. 1, 2012, pp. 566-575, XP 55726179, vol. 34, No. 7, Wiley Online Library, Hoboken, New Jersey, U.S.

* cited by examiner

CHEMICAL COMPOUNDS, OPTOELECTRONIC ELEMENTS COMPRISING AT LEAST ONE NEW CHEMICAL COMPOUND, AND USE OF NEW CHEMICAL COMPOUNDS IN AN OPTOELECTRONIC ELEMENT

CROSS REFERENCE TO RELATED APPLICATIONS

This application is a U.S. National Phase application under 35 U.S.C. § 371 of International Application No. PCT/EP2021/058534, filed on Mar. 31, 2021, and claims benefit to European Patent Application No. EP 20167382.9, filed on Mar. 31, 2020. The International Application was published in English on Oct. 7, 2021 as WO 2021/198388 A1 under PCT Article 21(2).

FIELD

The present invention relates to new chemical compounds of the general formula (Ia) and/or formula (Ib):

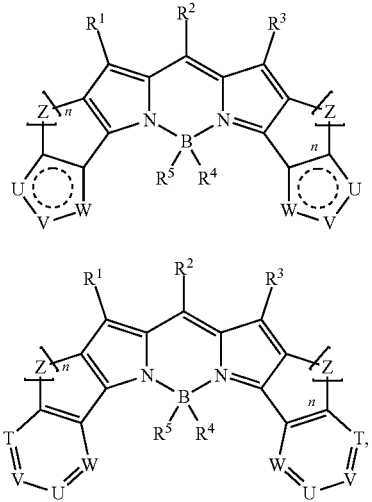

optoelectronic elements comprising new compounds, and use of new compounds in an optoelectronic element.

BACKGROUND

Organic optoelectronic devices are organic photovoltaic devices (OPV) converting light energy into electrical energy or organic light emitting devices (OLED) converting electrical energy into light. Optoelectronic elements, in particular organic solar cells or organic photodetectors, comprise at least two electrodes, an electrode and a counter electrode, wherein between the electrodes at least one photoactive layer, preferably at least one organic photoactive layer, is arranged, preferably as a light-absorbing layer. The photoactive layer might be a mixed layer or a stack of different photoactive layers. Further layers, in particular transport layers, may be arranged between the electrodes.

In the context of the present invention a photoactive layer is a layer which layer actively contributes as an absorber layer by absorption of light into electrical energy. In this context the term photoactive is understood to mean the conversion of light energy to electrical energy, e.g. solar cell converts light energy to electrical energy.

In contrast to inorganic solar cells, in organic photovoltaic elements free charge carriers are not directly created by light in organic photoactive compounds, but rather excitons are initially formed. In a second stage excitons are separated into free charge carriers which then contribute to the electrical current flow, see Reference 1, Reference 2, and Reference 3. The stack between the two electrodes may comprise one layer system wherein each layer system comprises at least one photoactive layer and at least one doped or partly doped transport layers, or may comprise a series of such layer systems comprising different organic photoactive compounds, and/or mixed layers comprising at least two organic photoactive compounds. The organic photoactive compounds are applied in form of thin films on the substrate by printing, by gluing, by coating, by vapour-deposition or otherwise.

Solar cells having organic active layers may be formed from polymers (U.S. Pat. No. 7,825,326B2) or small molecules (EP 2 385 556 A1). The advantages of such organic photoactive compounds over the conventional inorganic-based components, such as silicon, are the optical absorption coefficients, which are extremely high in some cases (up to $2\times10^5$ cm-1), thus, it is possible to produce very thin solar cells. Further aspects are low costs, the possibility to produce flexible large-area components on plastic films, and the virtually unlimited possible variations of organic chemistry.

Organic photovoltaic devices consist of a sequence of thin layers comprising organic compounds, polymers or small molecules, preferably applied by vapour deposition or from solution. Electrical contacts can be formed by metal layers, transparent conductive oxides (TCOs) and/or transparent conductive polymers (PEDOT-PSS, PANI).

There are several compounds which are useful as absorber materials in photovoltaic elements known from prior art.

WO2010133208A1 discloses an organic semiconductor, which comprises a plurality of layers, wherein at least one of the layers comprises at least one compound having an aza-bodipy skeleton.

WO2015036529A1 discloses an organic electronic device comprising at least two electrodes and at least one organic layer lying between the electrodes, the organic layer containing at least one pyrrolypyrrole-cyanine compound.

WO2014206860A1 discloses an organic optoelectronic component comprising at least one organic layer between two electrodes, wherein the organic layer comprises at least one compound from the group of defined BODIPYs.

WO2017114938A1 discloses compounds for use as a functional component in organic electronic devices, which enable improved absorption in organic solar cells or have an increased charge carrier mobility.

Particularly in the field of small molecules, there are only a few IR absorbers known in the range of 650 to 1400 nm for use in organic optoelectronic compounds. NIR (near-infrared) absorbers are of particular interest since they absorb in the invisible region of light and, therefore, appear transparent. However, absorbers known from the prior art are not entirely satisfactory, in particular process ability is not sufficient, they are not thermally stable during evaporation under reduced pressure, they do not have satisfactory absorption intensity in thin films, and/or photo stability is too low. In particular, many NIR dyes known in the art do not have satisfactory thin film absorptivity, which might be for several reasons, for example, due to improper film orientation or low molar extinction coefficient, insufficient photo stability, and/or insufficient transport properties. Thus, improvement of the absorption of light is needed.

SUMMARY

In an embodiment, the present disclosure provides Compounds of formula (Ia) and/or formula (Ib),

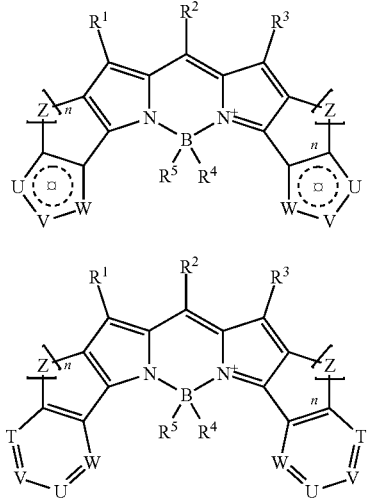

wherein R1 and R3 are independently selected from the group consisting of H, halogen, alkyl, fluorinated or partly fluorinated alkyl, and heteroaryl, R2 is selected from the group consisting of halogen, fluorinated and partly fluorinated alkyl, R4 and R5 are independently selected from the group consisting of halogen, alkyl, fluorinated or partly fluorinated alkyl, alkenyl, alkinyl, alkoxy, aryl, and heteroaryl, Z is independently selected from the group consisting of CH2, CHR6 or CR7R8, with R6, R7 and R8 independently selected from the group consisting of H, halogen, alkyl, alkoxy, aryl, and heteroaryl, wherein n is independently 1, 2 or 3, U, V and W of formula (Ia) independently form an aryl ring or a heteroaryl ring having moieties independently selected from the group consisting of CR9, S, O, N or NR10 with R9 and/or R10 independently selected from the group consisting of H, halogen, alkyl, alkoxy, alkthiooxy, aryl, and heteroaryl, and T, U, V and W of formula (Ib) form an aryl ring or a heteroaryl ring having moieties independently selected from the group consisting of CR9, S, O, N and NR10 with R9 and/or R10 independently selected from the group consisting of H, halogen, alkyl, aryl, and heteroaryl.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Figure 1:
FIG. 1 shows a schematic structure of an embodiment of an optoelectronic element.

In an embodiment, the present invention provides organic photoactive compounds which overcome the disadvantages of conventional compounds and can preferably be used in an optoelectronic element.

In the field of non-polymeric compounds only a few NIR-absorbers (near-infrared absorbers) are known in a spectral range of between 600 and 1400 nm as materials for organic optoelectronic elements. According to an embodiment of the present invention the near infrared spectrum is related to wavelengths above 600 nm up to 1400 nm. NIR-absorbers are from special interest because they are absorbing light in a non-visible area for the human eye. Therefore they seem to be transparent for the observer. One possible advantage would be to combine those materials with other colored absorbers to absorb a broader range of the solar spectra which could result in a higher current in a multi stack organic photovoltaic device.

Thus, a continuous improvement of NIR-absorbers for optoelectronic elements, in particular photoactive layers of stacks used in optoelectronic elements, is needed. In particular there is need to reduce absorption in the hypochromic part to avoid parasitic absorption in double or triple cells or to prepare transparent single cells with high PCE (Power Conversion Efficiency). Also NIR-absorbers as single active material in organic optoelectronic elements are desirable, especially if those materials do not have any absorption in the visible area for the human eye. Possible applications would be highly transparent organic solar cells or organic sensors.

In case of vapour deposition of absorbers, the compounds should be suitable for vacuum-deposition. State of the art knows NIR-absorbers are partly not sufficient. One reason can be the process ability and/or the thermal stability for an evaporation process under vacuum conditions. Typical organic infrared absorbers are cyanine dyes, which possess an ionic structure and therefore those dyes presumable possess extraordinary high evaporation temperatures. Additionally, those high evaporation temperatures would not be reached in a practical evaporation process, because a thermal decomposition of the organic component would occur.

Furthermore, a lot of state of the art NIR-absorbers do not possess a satisfying absorption strength in thin layers. One reason could be an unfavorable orientation after layer deposition, a low molar extinction coefficient, low photo stability, or insufficient transport properties, no energetically fit in the organic component for a useful usage of the absorbed irradiation.

Thus, there is a need of absorbers which show a good absorption in the near-infrared range, which absorbers in particular are evaporable in vacuum without showing decomposition and usable in organic optoelectronic elements.

In an embodiment, the present invention relates to compounds of formula (Ia) and/or formula (Ib)

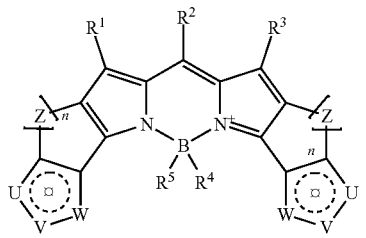

Ia

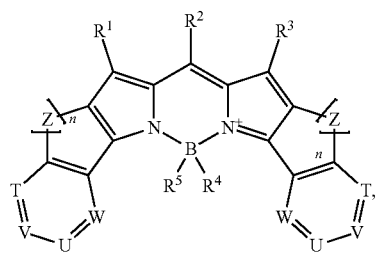

Ib an optoelectronic element, wherein the optoelectronic element comprises two electrodes and between these two electrodes at least one photoactive layer comprising at least one compound according to the present invention, and an use of a compound according to the present invention in an optoelectronic element.

The foregoing technical problems may be solved by compounds of formula (Ia) and/or formula (Ib)

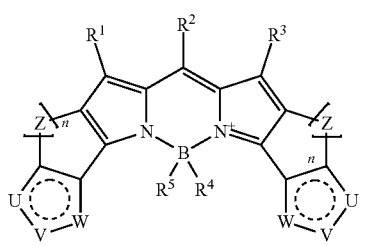

Ia

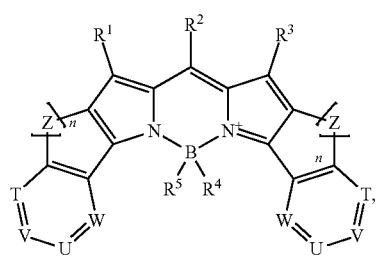

Ib wherein R1 and R3 are independently selected from H, halogen, alkyl, fluorinated or partly fluorinated alkyl, aryl, and heteroaryl, R2 is selected from halogen, fluorinated and partly fluorinated alkyl, R4 and R5 are independently selected from halogen, alkyl, fluorinated or partly fluorinated alkyl, alkenyl, alkinyl, alkoxy, aryl, and heteroaryl, Z is independently selected from $CH_2$, CHR6 or CR7R8, with R6, R7 and R8 independently selected from H, halogen, alkyl, alkoxy, aryl, and heteroaryl, wherein n is independently 1, 2 or 3, U, V and W of formula (Ia) independently form an aryl ring or a heteroaryl ring having moieties independently selected from the group consisting of CR9, S, O, N or NR10 with R9 and/or R10 independently selected from H, halogen, alkyl, alkoxy, alkthiooxy, aryl, and heteroaryl, and T, U, V and W of formula (Ib) form an aryl ring or a heteroaryl ring having moieties independently selected from the group consisting of CR9, S, O, N and NR10 with R9 and/or R10 independently selected from H, halogen, alkyl, aryl, and heteroaryl.

As used herein, the term alkthiooxy refers to the group —SR', wherein each R' is, independently a carbon moiety, such as an alkyl, alkenyl, or alkynyl group.

In an embodiment of the present invention in formula (Ia) and/or in formula (Ib) one of n is 1, preferably both of n are 1, forming a substituted or unsubstituted homocyclic 5-membered ring.

In an embodiment of the present invention in formula (Ia) and/or in formula (Ib) one of n is 2, preferably both of n are 2, forming a substituted or unsubstituted homocyclic 6-membered ring.

In an embodiment of the present invention U and V, and/or V and W of formula (Ia) form together a homo- or heterocyclic, saturated or unsaturated, and/or substituted or unsubstituted ring.

In an embodiment of the present invention T and U, U and V, and/or V and W of formula (Ib) form together a homo- or heterocyclic, saturated or unsaturated, and/or substituted or unsubstituted ring.

In the context of the present disclosure, substituted means that one or more hydrogen of a group is substituted by Alkyl, Alkenyl, Alkinyl, Aryl, Alkanol, O-Alkyl, O-Alkylen, O-Alkin, O-Aryl, Hydroxy, Carboxy, Nitro or Halogen.

Compounds according to embodiments of the present invention are in particular "small molecules" which are understood to be non-polymeric organic molecules having a defined molecular structure and a molar mass of between 100 and 2000 g/mol. Such "small molecules" are free of undefined, possible reactive groups at the end of the molecular chain, and show ability to vaporize in vacuum and the associated possibility of purification by gradient sublimation, as one result layers comprising small molecules can be deposited by vapour deposition.

Compounds according to embodiments of the present invention show advantageous effects compared to compounds state of the art. Surprisingly it has been found that layers comprising at least one compound according to the present invention absorb broadly in the near-infrared range, which is no longer visible to the human eye. Surprisingly, it has been found that compounds according to the present invention defined by formula (Ia) and/or formula (Ib) show an particularly good absorption of near-infrared light. Surprisingly, compounds of the present invention show a significant bathochromic shift in the absorption spectra from solution compared to thin film, presumable due to J-aggregate type formation of the evaporated thin film. The compounds according to the present invention are good evaporable and thermal stable up to more than 300° C. and can be processed without any decomposition by thermal evaporation under reduced pressure. In addition, it is possible to transfer energy absorbed at a heterojunction with molecules having acceptor character (e.g. fullerene C60) to free charge carrier pairs and ultimately convert it into electrical energy.

Furthermore, the compounds of the present invention possess excellent transport properties. Surprisingly compound of the present invention show high open circuit voltage values for materials with low optical band gap, which is beneficial for efficiency improvement of photovoltaic elements. Advantageously, usage as single compound or in multi junction devices is possible. Advantageously, compounds according to the present invention can be fitted by slight variations into the layer system of an optoelectronic element. It has been shown that compounds according to the present invention have high thermal stability and can be evaporated in vacuum. Advantageously, compounds according to the present invention show less parasitic absorption in the visible area of the light spectra, in particular in multi junction devices on hypsochromic absorption edge, which results in higher transparency for the human eye.

In an embodiment of the present invention R2 is selected from F, $CF_3$, and $C_2F_5$, preferably R2 is $CF_3$, and/or wherein R4 and R5 are independently halogen, preferably F.

In an embodiment of the present invention R1 and R3 are independently H or alkyl, preferably R1 and R3 are independently selected from H, methyl, ethyl, and propyl, particularly preferred R1 and R3 are H.

In an embodiment of the present invention R9 and/or R10 are independently selected from H, halogen, branched or linear, cyclic or non-cyclic alkyl, preferably with not more than 10 carbon units, particularly preferred not more than 6 carbon units, very particularly preferred not more than 5 carbon units, alkoxy, preferably with not more than 10 carbon units, particularly preferred not more than 6 carbon units, very particularly preferred not more than 5 carbon units, aryl, and heteroaryl.

In an embodiment of the present invention R9 and/or R10 are independently selected from H, alkyl, aryl, and heteroaryl.

In an embodiment of the present invention Z is independently $CH_2$ or CHR6, with R6 independently selected from H, halogen, alkyl, alkoxy, aryl, and heteroaryl, and n is independently 1 or 2, preferably Z is $CH_2$, and n is independently 1 or 2, particularly preferred n is 2.

In an embodiment of the present invention the compounds are of formula (Ia),

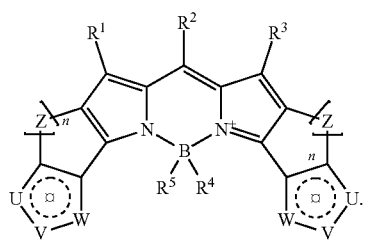

Ia

In an embodiment of the present invention the compounds are of formula (Ib),

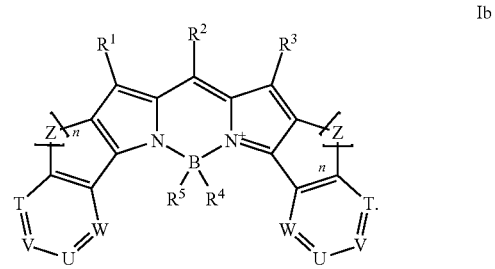

Ib

In an embodiment of the present invention T, U, V, W of formula (Ib) independently form an aryl ring, preferably T, U, V, W of formula (Ib) are CH or CR9 with R9 independently selected from H, alkyl, aryl, and heteroaryl.

In an embodiment of the present invention T, U, V, W of formula (Ib) independently form an heteroaryl ring, preferably T, U, V and/or W of formula (Ib) are CH or CR9 with R9 independently selected from H, alkyl, aryl, and heteroaryl, while at least one of T, U, V, W of formula (Ib) is N or NR10 with R10 independently selected from H, halogen, alkyl, aryl, and heteroaryl, preferably one of T, U, V, W of formula (Ib) is N or NR10 with R10 selected from H, halogen, alkyl, aryl, and heteroaryl.

In an embodiment of the present invention T, U, V and/or W of formula (Ib) are CH or CR9 with R9 independently selected from H, alkyl, aryl, and heteroaryl, while one of T, U, V, W of formula (Ib) is N, preferably U is N or preferably V is N.

In an embodiment of the present invention U, V, W of formula (Ia) independently form an heteroaryl ring, preferably at least one of U, V, W of formula (Ia) is S, particularly preferred U and/or W of formula (Ia) are S.

In an embodiment of the present invention each U, V, and/or W of formula (Ia) are the same.

In an embodiment of the present invention each T, U, V, and/or W of formula (Ib) are the same.

In an embodiment of the present invention U and/or V of formula (Ib) are CR9 with R9 independently selected from alkyl, aryl, and heteroaryl, preferably V of formula (Ib) is CR9 with R9 independently selected from alkyl, aryl, and heteroaryl.

In an embodiment of the present invention R9 and/or R10 of formula (Ia) and/or of formula (Ib) are H.

In an embodiment of the present invention at least one further five-membered ring and/or six-membered ring, preferably one or two further five-membered rings and/or six-membered rings, is fused to U, V, W of formula (Ia) or to T, U, V, W of formula (Ib), wherein the five-membered rings and/or six-membered rings are preferably substituted and/or non-substituted aryl and/or heteroaryl rings.

In an embodiment of the present invention R1 and R3 are no aryl and/or no heteroaryl, and/or wherein R9 and/or R10 are no alkoxy, no aryloxy, and/or no heteroaryloxy.

In an embodiment of the present invention the compounds are selected from the group consisting of

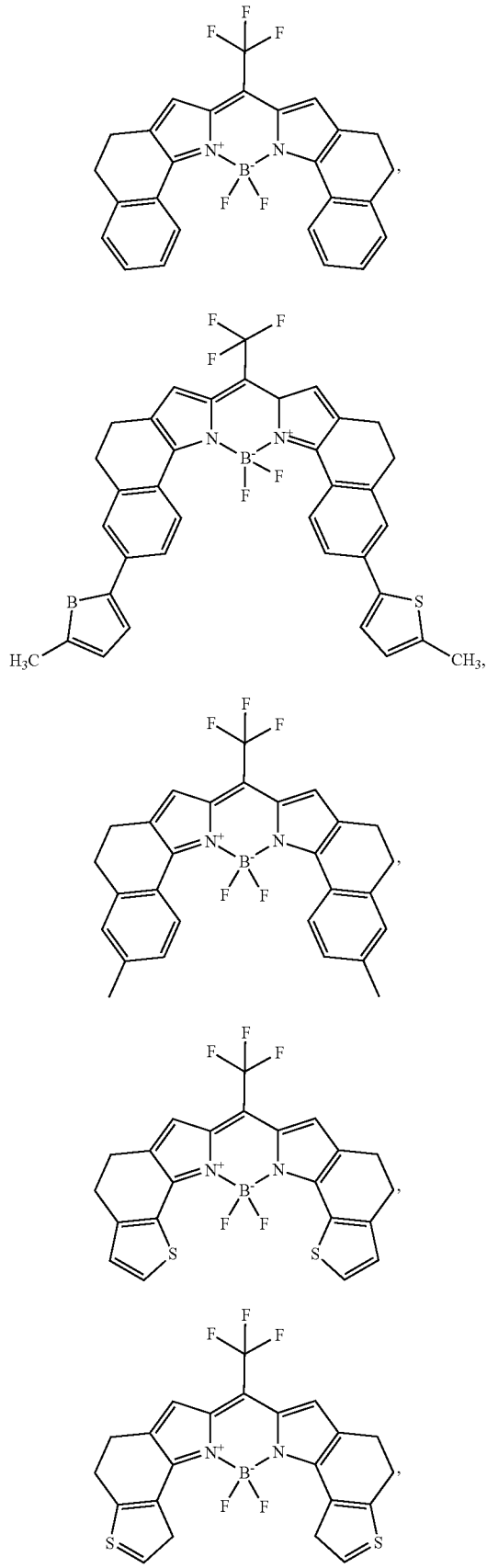
-continued
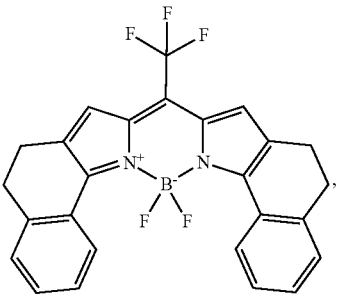
In an embodiment of the present invention formula (Ia) and/or formula (Ib) are symmetrical towards an axis through B and R2.
In an embodiment of the present invention the compounds are selected from the group consisting of

C

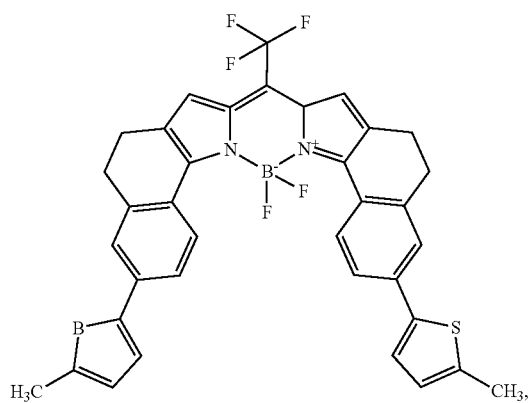

D

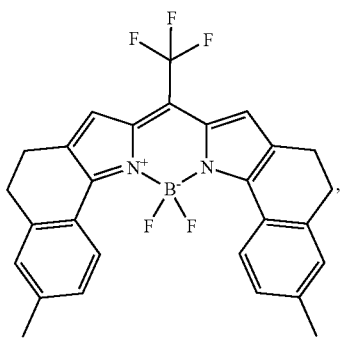

G

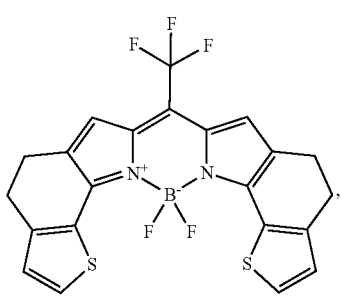

H

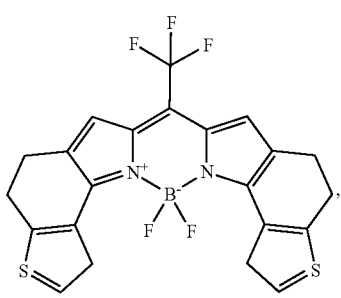

J

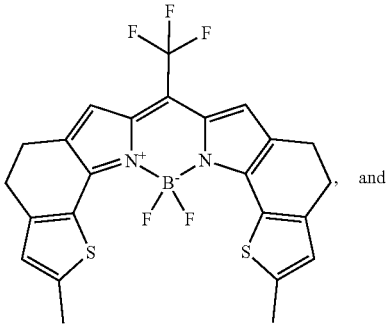

, and

K

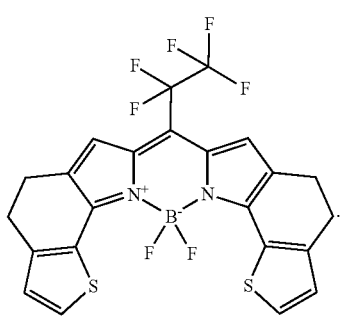

In an embodiment of the present invention the compounds are selected from the group consisting of

A

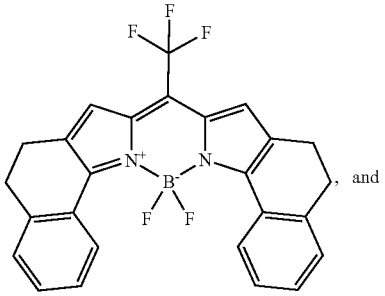

, and

G

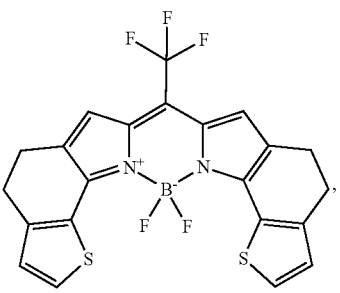

The underlying technical problem of an embodiment of the present invention is also solved by providing an optoelectronic element, wherein the optoelectronic element comprises two electrodes and between these two electrodes at least one photoactive layer comprising at least one compound according to the present invention, in particular according to any of the previously described embodiments. This in particular results in advantageous effects of the optoelectronic element as already previously described in the context of the compounds according to the present invention.

In an embodiment of the present invention the optoelectronic device is a light absorbing device converting light energy into electrical energy.

In an embodiment of the present invention the at least one photoactive layer is a light absorbing layer.

In an embodiment of the present invention the optoelectronic element comprises at least two, preferably at least three, more preferably at least four photoactive layers between the electrode and the counter electrode.

In an embodiment of the present invention the photovoltaic element is a double or triple cell comprising several absorbers, in particular absorbers absorbing at different wavelength range.

In an embodiment of the present invention the optoelectronic element is an organic optoelectronic element.

In an embodiment of the present invention the optoelectronic element is a solar cell, an OLED, an OFET, or a photodetector.

The underlying technical problem of uses of conventional compounds are also solved by providing a use of a compound according to an embodiment of the present invention in an optoelectronic element, preferably in an organic optoelectronic element, particularly preferred in an organic solar cell, an OFET, an OLED, or a photodetector, in particular according to any of the previously described embodiments. This results in advantageous effects of the use of a compound according to an embodiment of the present invention in an optoelectronic element as already previously described in the context of the compounds according to embodiments of the present invention and the optoelectronic element according to embodiments of the present invention.

SYNTHESIS OF THE INTERMEDIATES AND THE COMPOUNDS

In the synthesis of intermediates and the compounds according to an embodiment of the present invention a combination of known procedures described in the literature is used. These procedures are included in this application by reference:

General procedure A: Grignard reaction Reference 7

General procedure B: re-arrangement Reference 8

General procedure C: ketoxime Reference 10

General procedure D: modified Trofimov reaction Reference 11

General procedure E: CF$_3$-BODIPY synthesis Reference 12

4,5-D4,5-Dihydro-1H-benzo[g]indole (A1)

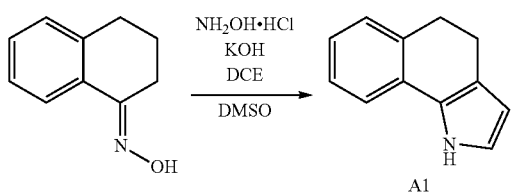

Molecule A1 was synthesized according to a modified Trofimov reaction described in Reference 13.

Bodipy (A)

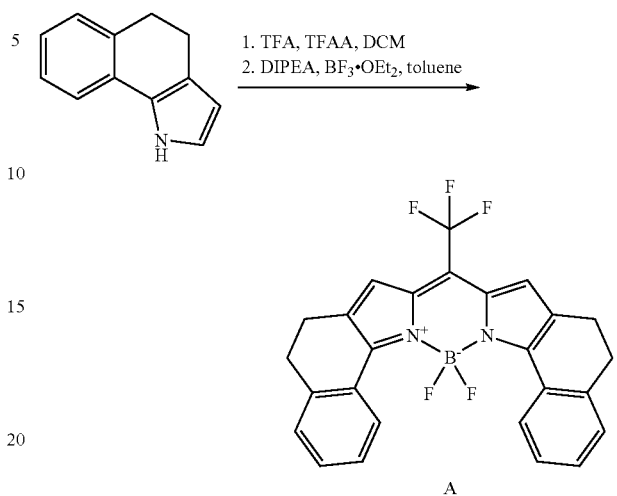

Compound A was prepared from A1 according to general procedure E in 24% yield.

$^1$H NMR (CDCl$_3$, 400 MHz): δ=8.75 (d, $^3$J=7.8 Hz, 2H), 7.45 (t, $^3$J=7.2 Hz, 2H), 7.36 (t, $^3$J=7.6 Hz, 2H), 7.28 (d, $^3$J=7.2 Hz, 2H), 7.12 (s, 2H), 2.94 (m, 4H), 2.77 (m, 4H).

6-Methoxy-3,4-dihydro-2H-naphthalen-1-one oxime (B1)

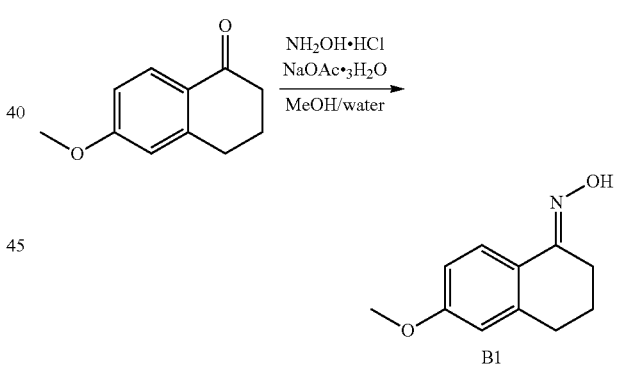

Compound B1 was prepared according to general procedure C in 98% yield. GC-MS (EI, 70 eV) m/z 191.0 (M$^+$, 100%).

7-Methoxy-4,5-dihydro-1H-benzo[g]indole (B2)

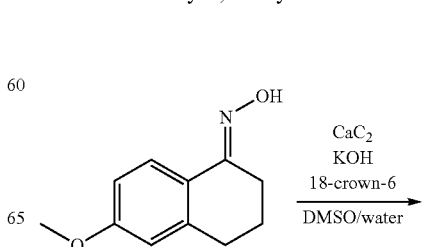

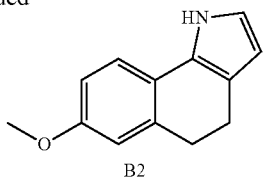

B2

Compound B2 was prepared from B1 according to general procedure D in 59% yield.

$^1$H NMR (CDCl$_3$, 400 MHz): δ=8.25 (broad s, 1H), 7.08 (d, $^3$J=8.0 Hz, 1H), 6.80 (d, $^3$J=2.4 Hz, 1H), 6.74-6.71 (m, 2H), 6.11 (t, $^3$J=2.4 Hz, 2H), 3.81 (s, 3H), 2.93-2.89 (m, 4H), 2.76-2.72 (m, 4H).

Bodipy (B)

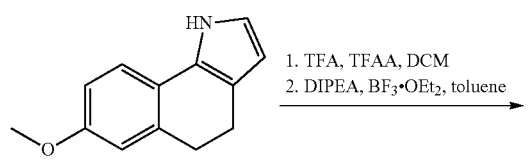

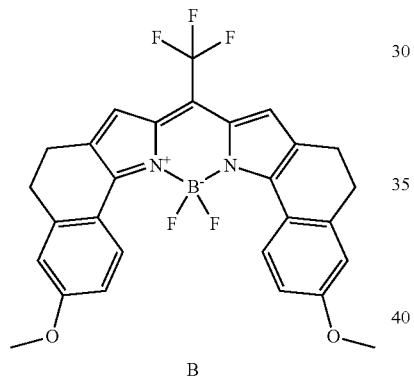

B

Compound B was prepared from B2 according to general procedure E in 66% yield.

$^1$H NMR (CDCl$_3$, 400 MHz): δ=8.71 (d, $^3$J=9.2 Hz, 2H), 7.05 (broad s, 2H), 6.98 (dd, $^3$J=8.8 Hz, $^4$J=2.8 Hz, 2H), 6.81 (d, $^3$J=2.8 Hz, 2H), 3.89 (s, 6H), 2.95-2.86 (m, 4H), 2.80-2.70 (m, 4H).

6-Bromo-3,4-dihydro-2H-naphthalen-1-one (C1)

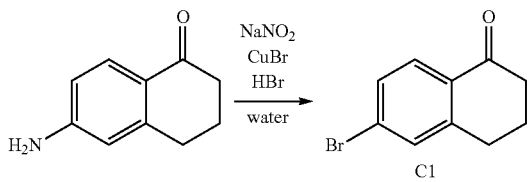

C1 was prepared by a Sandmayer reaction described in Reference 12 in 88% yield.

GC-MS (EI, 70 eV) m/z 224.05 (M$^+$−1, 100%).

6-Bromo-3,4-dihydro-2H-naphthalen-1-one oxime (C2)

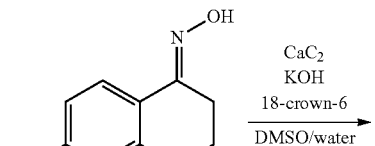

C2

Compound C2 was prepared from C1 according to general procedure C in 95% yield.

GC-MS (EI, 70 eV) m/z 241.03 (M++1, 100%).

7-Bromo-4,5-dihydro-1H-benz[g]indole (C3)

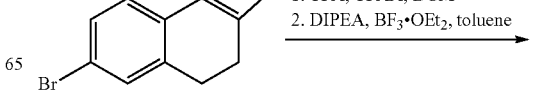

C3

Compound C3 was prepared from C2 according to general procedure D in 57% yield.

$^1$H NMR (CDCl$_3$, 400 MHz): δ=8.28 (broad s, 1H), 7.34-7.32 (m, 1H), 7.29 (dd, $^3$J=8.0 Hz, $^4$J=2.0 Hz, 1H), 7.00 (d, $^3$J=8.0 Hz, 1H), 6.77 (t, $^3$J=2.8 Hz, 1H), 6.13 (t, $^3$J=2.4 Hz, 1H), 2.93-2.87 (m, 4H), 2.76-2.71 (m, 4H).

Bodipy (C4)

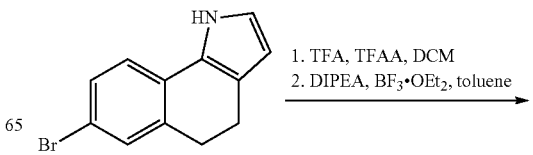

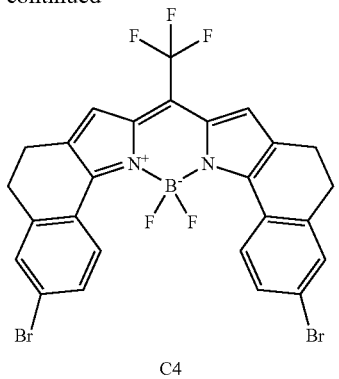

C4

Compound C4 was prepared from C3 according to general procedure E in 46% yield.

$^1$H NMR (TCE, 500 MHz): δ=8.61 (d, $^3$J=8.5 Hz, 2H), 7.63 (d, $^3$J=8.5 Hz, 2H), 7.52 (s, 2H), 7.19 (s, 2H), 3.00-2.95 (m, 4H), 2.85-2.80 (m, 4H).

Bodipy (C)

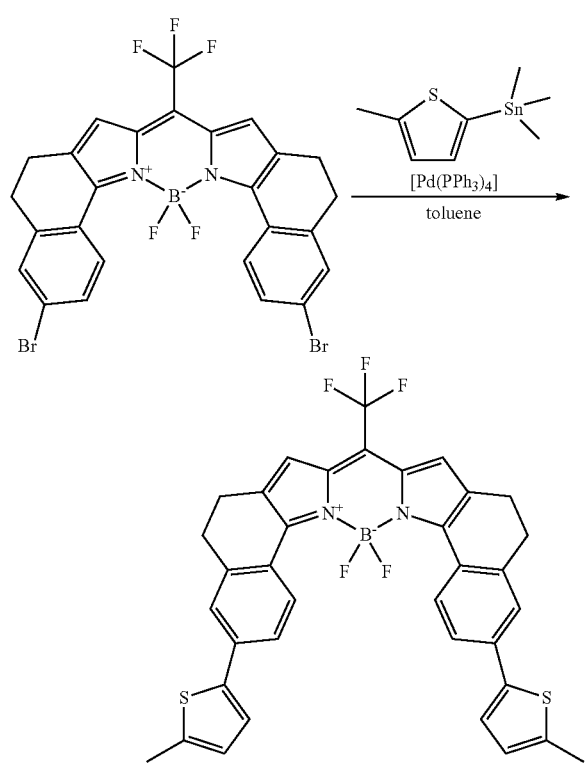

Compound C4 was filled in a three-neck flask. It was then dissolved in toluene and trimethyl-(5-methyl-thiophen-2-yl)-stannane (2.4 eq) added followed by palladium tetrakis (5 mol %). The reaction mixture was heated at 90° C. for 1 h. The temperature was then increased to 110° C. and stirring continued for 2 h. The reaction mixture was cooled to room temperature, dissolved in DCM and washed with water. The two layers were separated and the organic layer was washed two times with water. The combined aqueous layer was extracted with DCM twice, dried over Na$_2$SO$_4$, filtered and the solvents were evaporated under vacuum. The obtained crude was then washed with MeOH (3 times 5 mL) and hexane (3 times 5 mL). The solid was filtered and dried. m=141.2 mg (0,215 mmol, 79%).

$^1$H NMR (CDCl$_3$, 400 MHz): δ=8.74 (d, $^3$J=8.8 Hz, 2H), 7.65 (dd, $^3$J=8.4 Hz, $^4$J=2.0 Hz, 2H), 7.45 (d, $^3$J=1.6 Hz, 2H), 7.10 (s, 2H), 6.79-6.76 (m, 2H), 3.00-2.92 (m, 4H), 2.84-2.73 (m, 4H), 2.54 (s, 6H).

6-Methyl-3,4-dihydro-2H-naphthalen-1-one oxime (D1)

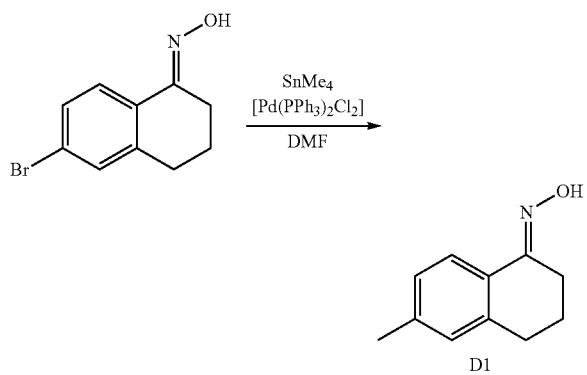

Oxime C2 (1 eq.), DMF, tetramethyltin (1.1 eq.) and bis(triphenylphosphine) palladium(II) dichloride (5 mol %) was filled in a 50 ml flask. The reaction mixture was heated at 90° C. overnight. Once cooled down to room temperature, the reaction mixture was diluted in DCM and washed with water. The layers were separated, the organic layer was dried over Na$_2$SO$_4$, filtered and the solvents were removed under reduce pressure. The crude was purified by column chromatography (conditions: stationary phase: silica gel, eluent 80/20 DCM/PE->100% DCM->90/10 DCM/EA) and afforded 66% of the targeted molecule.

$^1$H NMR (CDCl$_3$, 400 MHz): δ=7.82 (d, $^3$J=8.0 Hz, 1H), 7.04 (d, $^3$J=8.8 Hz, 1H), 6.98 (s, 1H), 2.83 (t, $^3$J=6.8 Hz, 2H), 2.73 (t, $^3$J=6.4 Hz, 2H), 1.91-1.83 (m, 2H).

7-Methyl-4,5-dihydro-1H-benz[g]indole (D2)

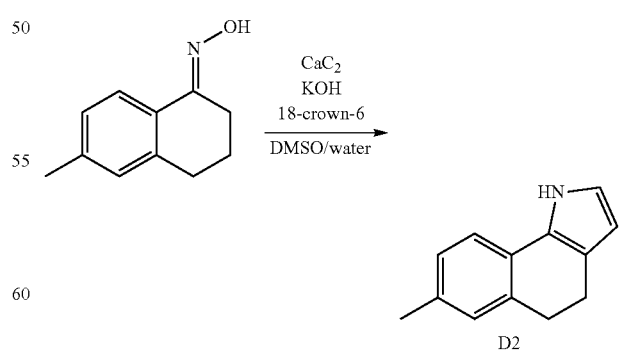

Compound D2 was prepared from D1 according to general procedure D in 60% yield.

GC-MS (EI, 70 eV) m/z 182.13 (M+, 100%).

Bodipy (D)

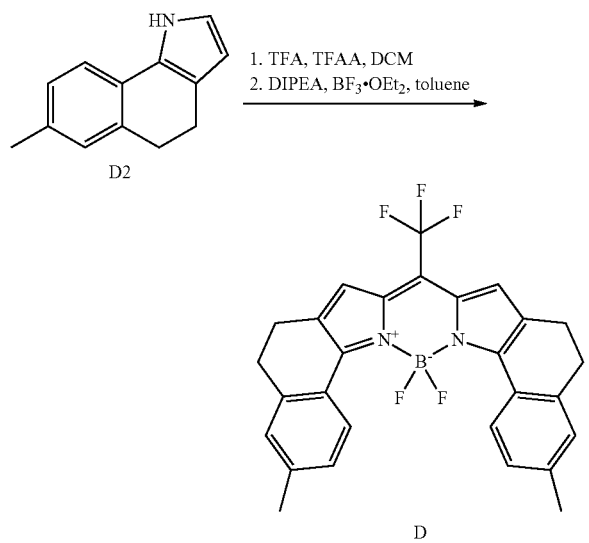

Compound D was prepared from D2 according to general procedure E in 66% yield.

$^1$H NMR (CDCl$_3$, 400 MHz): δ=8.66 (d, $^3$J=8.4 Hz, 2H), 7.29-7.25 (m, 2H), 7.15-7.08 (m, 4H), 2.95-2.88 (m, 4H), 2.80-2.74 (m, 4H), 2.42 (s, 6H).

Bodipy (E)

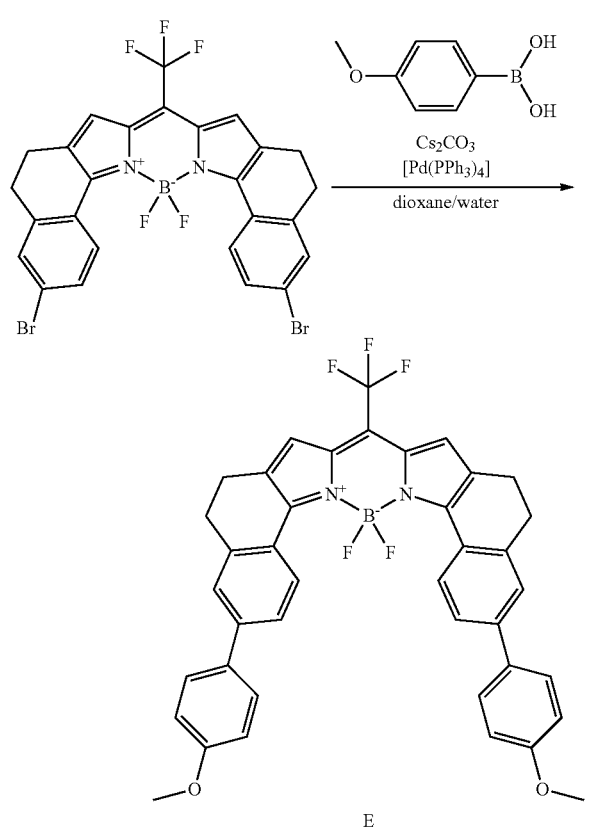

Compound C4 (1 eq.), the boronic acid (2.5 eq.), the caesium carbonate (3 eq.), water and dioxane were put together in a 100 ml three-neck flask. The solution was then degassed with argon for 30 min. Palladium tetrakis (10 mol %) was added and the reaction mixture was heated at 80° C. overnight. The reaction mixture was diluted in DCM and washed with water. The layers were separated, and the organic layer was washed twice with DCM. The aqueous layer was extracted twice with DCM. The combined organic layer was dried over Na$_2$SO$_4$, filtered and the solvents were evaporated under reduced pressure. The crude was then purified by column chromatography (conditions: stationary phase: silica gel, eluent: 80/20 PE/DCM to 50/50) which afforded 69% of the target material as purple needles.

$^1$H NMR (CDCl$_3$, 400 MHz): δ=8.75 (d, $^3$J=8.4 Hz, 2H), 7.62-7.54 (m, 6H), 7.42 (d, $^3$J=2.0 Hz, 2H), 7.05 (broad s, 2H), 6.97-6.90 (m, 4H), 3.80 (s, 6H), 2.96-2.90 (m, 4H), 2.78-2.70 (m, 4H).

Bodipy (F)

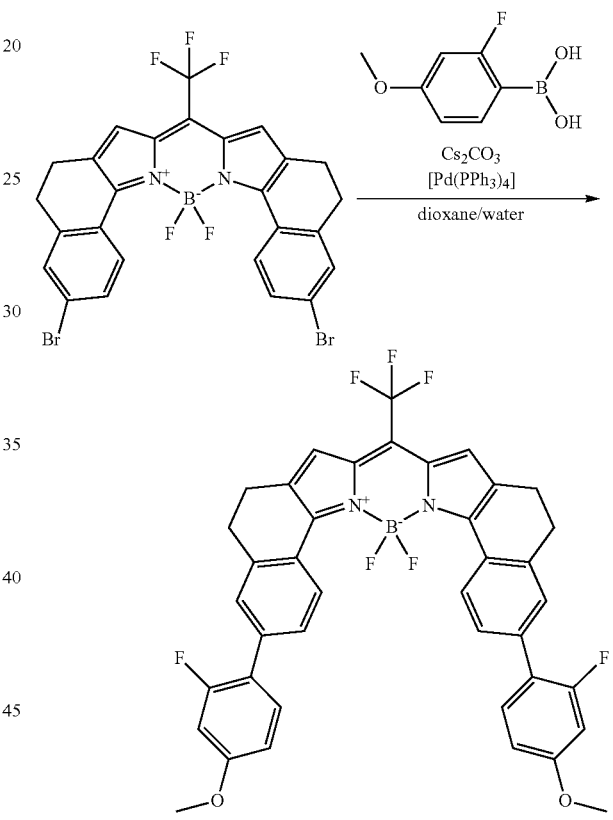

Compound C4 (1 eq.), the boronic acid (4 eq.), the caesium carbonate (3 eq.), water and dioxane were put together in a 100 ml three-neck flask. The solution was then degassed with argon for 30 min. Palladium tetrakis (10 mol %) was then added and the reaction mixture was heated at 80° C. overnight. The reaction mixture was diluted in DCM and washed with water. The layers were separated and the organic layer was washed twice with DCM. The aqueous layer was extracted twice with DCM. The combined organic layer was dried over Na$_2$SO$_4$, filtered and the solvents were evaporated under reduced pressure. The crude was then purified by column chromatography (conditions: stationary phase: silica gel, eluent: 80/20 PE/DCM to 50/50) which afforded 89% of the target material.

$^1$H NMR (TCE-d$_2$, 400 MHz): δ=8.77 (d, $^3$J=8.8 Hz, 2H), 7.65 (d, $^3$J=8.4 Hz, 2H), 7.53-7.47 (m, 4H), 7.16 (broad s, 2H), 6.81 (ABq, $^3J$=2.4 Hz, $J_{AB}$=20.8 Hz, 2H), 6.79 (ABq, $^3J$=2.4 Hz, $J_{AB}$=24.8 Hz, 2H), 3.87 (s, 6H), 3.04-2.98 (m, 4H), 2.86-2.81 (m, 4H).

1-Thiophen-2-yl-cyclobutanol (G1)

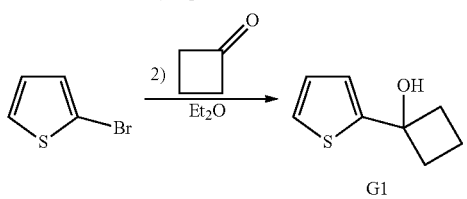

Compound G1 was prepared from 2-bromothiophene according to general procedure A in 85% yield.

$^1$H NMR (CDCl$_3$, 400 MHz): δ=7.25 (dd, $^3J$=5.2 Hz, $^4J$=1.2 Hz, 1H), 7.07 (dd, $^3J$=3.6 Hz, $^4J$=1.2 Hz, 1H), 6.98 (dd, $^3J$=5.2 Hz, $^3J$=3.6 Hz, 1H), 2.58-2.50 (m, 2H), 2.49-2.39 (m, 2H), 1.99-1.88 (m, 1H), 1.80-1.70 (m, 1H).

5,6-Dihydro-4H-benzo[b]thiophen-7-one (G2)

Compound G2 was prepared from G1 according to general procedure B in 65% yield.

$^1$H NMR (CDCl3, 400 MHz): δ=7.60 (d, $^3J$=5.2 Hz, 1H), 6.97 (d, $^3J$=5.2 Hz, 1H), 2.87 (t, $^3J$=6.0 Hz, 2H), 2.63-2.57 (m, 2H), 2.21-2.13 (m, 2H). NMR in agreement with the one given in the literature Reference 9.

5,6-Dihydro-4H-benzo[b]thiophen-7-one oxime (G3)

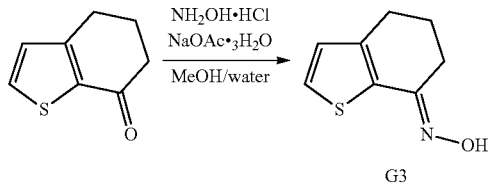 [SMILES: O=C1CCCc2ccsc21 ; O/N=C1\CCCc2ccsc21]

Compound G3 was prepared from G2 according to general procedure C in 95% yield. Two isomers were detected on NMR and GC-MS in a 6:4 ratio.

$^1$H NMR (CDCl$_3$, 400 MHz): δ=7.53 (d, $^3J$=5.2 Hz, 1H (0.6)), 7.21 (d, $^3J$=5.2 Hz, 1H (0.4)), 6.94 (d, $^3J$=5.2 Hz, 1H (0.6)), 6.85 (d, $^3J$=5.2 Hz, 1H (0.4)), 2.90-2.78 (m, 2H), 2.75-2.66 (m, 2H), 2.07-1.91 (m, 2H).

4,8-Dihydro-5H-thieno[3,2-g]indole (G4)

Compound G4 was prepared from G3 according to general procedure D in 30% yield.

GC-MS (EI, 70 eV) m/z 174.14 (M$^+$, 100%).

Bodipy (G)

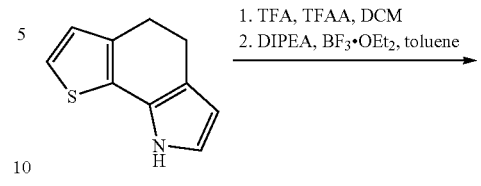

Compound G was prepared from G4 according to general procedure E in 45% yield.

$^1$H NMR (CDCl$_3$, 400 MHz): δ=7.61 (d, $^3J$=5.2 Hz, 2H), 7.03-6.99 (m, 4H), 3.02-2.97 (m, 4H), 2.89-2.84 (m, 4H).

1-Thiophen-3-yl-cyclobutanol (H1)

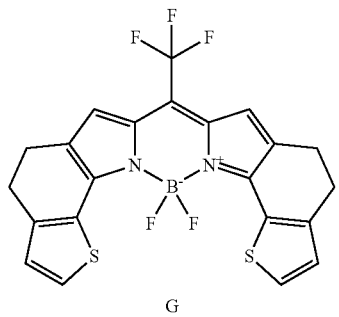

3-bromothiophene (1 eq.) was put in a dry three-neck-flask under argon. Hexane was added. The solution was cooled to −40° C. Under stirring, n-BuLi (1.1 eq.) was added dropwise. THF was added. The reaction mixture was stirred for 30 minutes at −40° C. Cyclobutanone (1.1 eq.) was added. The reaction mixture was stirred for 30 minutes at −40° C. It was then allowed to reach room temperature. The reaction mixture was diluted in DCM and was then washed with a saturated solution of NH$_4$Cl. The layers were separated and the organic layer was washed with water twice. It was then dried over Na$_2$SO$_4$, filtered and the solvents were evaporated. The crude was pure enough and directly use in the next step (79% yield).

$^1$H NMR (CDCl$_3$, 400 MHz): δ=7.34-7.30 (m, 1H), 7.27-7.24 (m, 1H), 7.19 (dd, $^3J$=5.2 Hz, $^4J$=1.6 Hz, 1H), 2.53-2.44 (m, 2H), 2.43-2.33 (m, 2H), 1.99-1.88 (m, 1H), 1.76-1.62 (m, 1H).

5,6,7,7a-Tetrahydro-3aH-benzo[b]thiophen-4-one (H2)

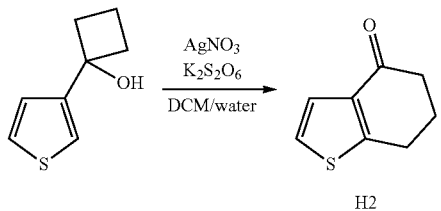

Compound H2 was prepared from H1 according to general procedure B in 28% yield.

GC-MS (EI, 70 eV) m/z 152.14 (M$^r$, 100%).

6,7-Dihydro-5H-benzo[b]thiophen-4-one oxime (H3)

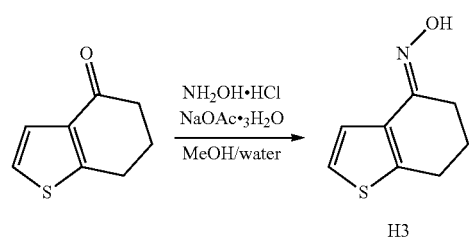

Compound H3 was prepared from H2 according to general procedure C in 79% yield.

$^1$H NMR (DMSO, 400 MHz): δ=10.36 (s, 1H), 7.73 (d, $^3$J=5.6 Hz, 1H), 7.67 (d, $^3$J=5.2 Hz, 1H), 3.33 (t, $^3$J=6.0 Hz, 2H), 3.21-3.16 (m, 2H), 2.46-2.38 (m, 2H).

4,5-Dihydro-1H-thieno[2,3-g]indole (H4)

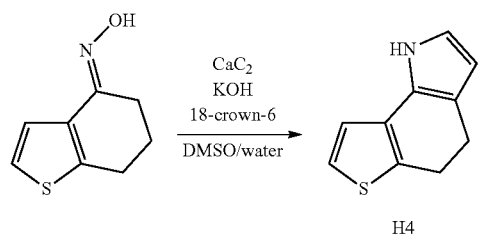

Compound H4 was prepared from H3 according to general procedure D in 51% yield.

GC-MS (EI, 70 eV) m/z 173.99 (M$^+$, 100%).

Bodipy (H)

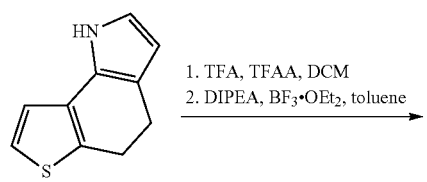

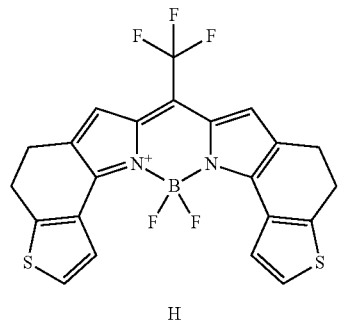

Compound H was prepared from H4 according to general procedure E in 50% yield.

$^1$H NMR (CDCl$_3$, 400 MHz): δ=8.12 (d, $^3$J=5.6 Hz, 2H), 7.25 (d, $^3$J=5.2 Hz, 2H), 7.06 (broad s, 2H), 3.13-2.08 (m, 4H), 2.95-2.90 (m, 4H).

Benzo[b]thiophen-2-yl-cyclobutanol (H1)

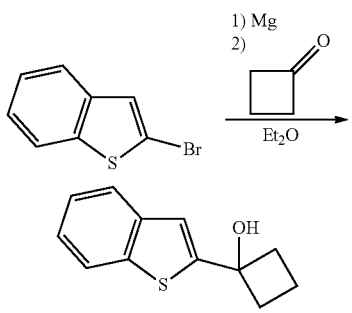

Compound I1 was prepared from 2-bromobenzothiophene according to general procedure A in 90% yield.

GC-MS (EI, 70 eV) m/z 204.13 (M$^+$, 100%).

2,3-Dihydro-1H-dibenzothiophen-4-one (I2)

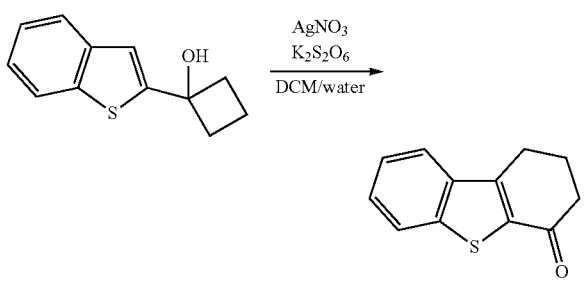

Compound I2 was prepared from I1 according to general procedure B in 65% yield.

GC-MS (EI, 70 eV) m/z 202.10 (M$^+$, 100%).

2,3-Dihydro-1H-dibenzothiophen-4-one oxime (I3)

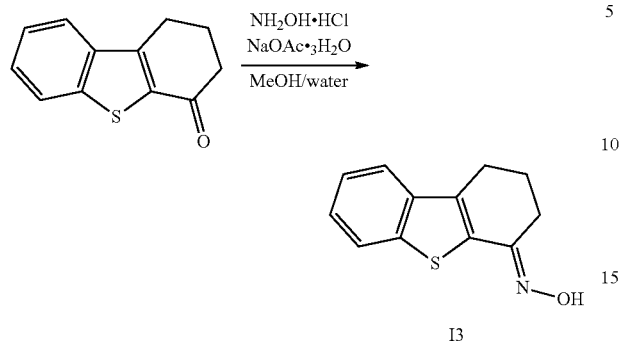

Compound I3 was prepared from I2 according to general procedure C in 27% yield.

GC-MS (EI, 70 eV) m/z 217.03 (M$^+$, 100%).

4,5-Dihydro-1H-10-thia-1-aza-cyclopenta[a]fluorene (I4)

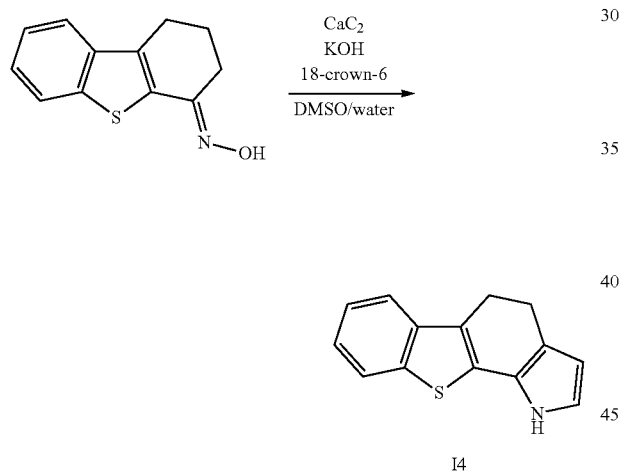

Compound I4 was prepared from I3 according to general procedure D in 38% yield.

GC-MS (EI, 70 eV) m/z 225.19 (M$^+$, 100%).

Bodipy (I)

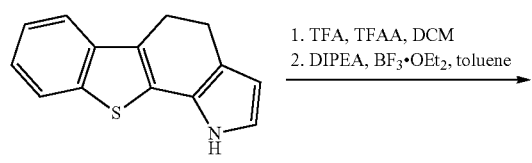

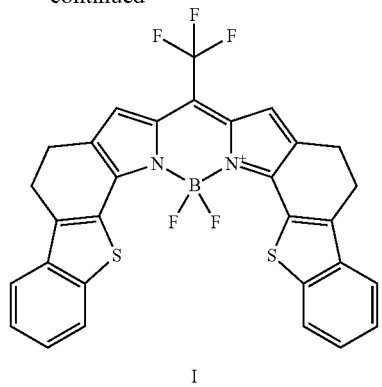

Compound I was prepared from I4 according to general procedure E in 56% yield.

$^1$H NMR (TCE-d$_2$, 400 MHz): δ=8.02 (d, $^3$J=6.4 Hz, 2H), 7.85 (dd, $^3$J=5.2 Hz, $^4$J=1.2 Hz, 2H), 7.53-7.45 (m, 4H), 7.15 (broad s, 2H), 3.30-3.25 (m, 4H), 3.10-3.04 (m, 4H).

1-(5-Methyl-thiophen-2-yl)-cyclobutanol (J1)

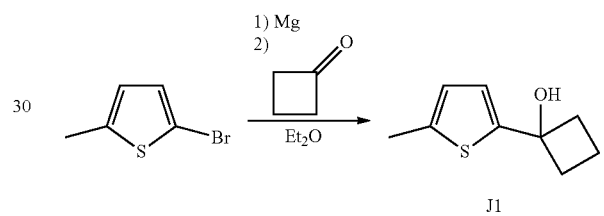

Compound J1 was prepared from 2-bromo-5-methylthiophene according to general procedure A in 89% yield.

GC-MS (EI, 70 eV) m/z 168.04 (M$^+$, 10%), 153.70 (M$^+$−15, 20%), 140.02 (M$^+$−28, 100%).

2-Methyl-5,6-dihydro-4H-benzo[b]thiophen-7-one (J2)

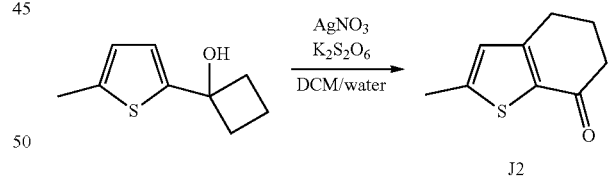

Compound J2 was prepared from J1 according to general procedure B in 34% yield.

GC-MS (EI, 70 eV) m/z 166.11 (M$^+$, 100%).

2-Methyl-5,6-dihydro-4H-benzo[b]thiophen-7-one oxime (J3)

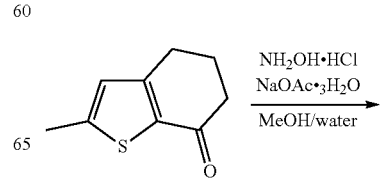

-continued

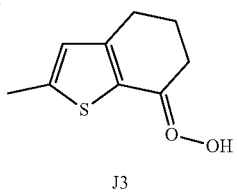

J3

Compound J3 was prepared from J2 according to general procedure C in 60% yield.

$^1$H NMR (CDCl$_3$, 400 MHz): δ=8.14 (broad s, 1H), 6.51 (s, 1H), 2.80-2.75 (m, 2H), 2.66-2.61 (m, 4H), 2.43 (s, 3H), 1.96-1.88 (m, 2H).

2-Methyl-4,8-dihydro-5H-thieno[3,2-g]indole (J4)

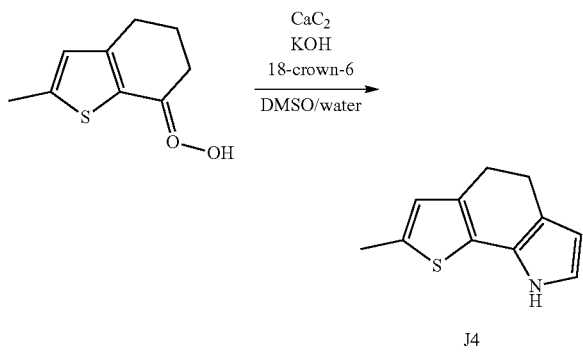

Compound J4 was prepared from J3 according to general procedure D in 29% yield.

GC-MS (EI, 70 eV) m/z 189.20 (M$^+$, 100%).

Bodipy (J)

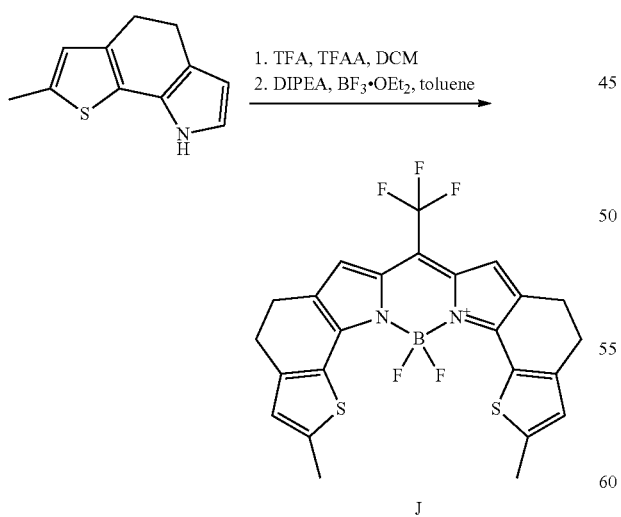

Compound J was prepared from J4 according to general procedure E in 30% yield.

$^1$H NMR (TCE-d$_2$, 400 MHz): δ=7.01 (s, 2H), 6.76 (s, 2H), 2.99-2.94 (m, 4H), 2.92-2.87 (m, 4H), 2.65 (s, 6H).

Figure 5A:
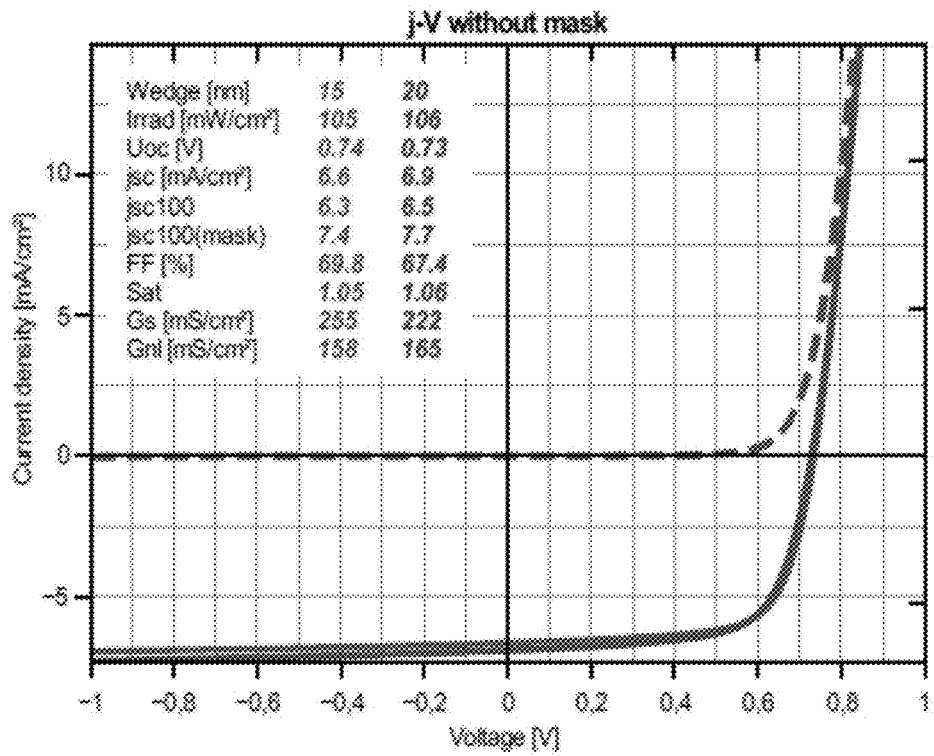
FIGS. 5A-B shows in an embodiment the current-voltage curve with parameters open circuit voltage Voc, short-circuit current Isc, and fill factor FF an optoelectronic element comprising compound G.
Figure 5B:
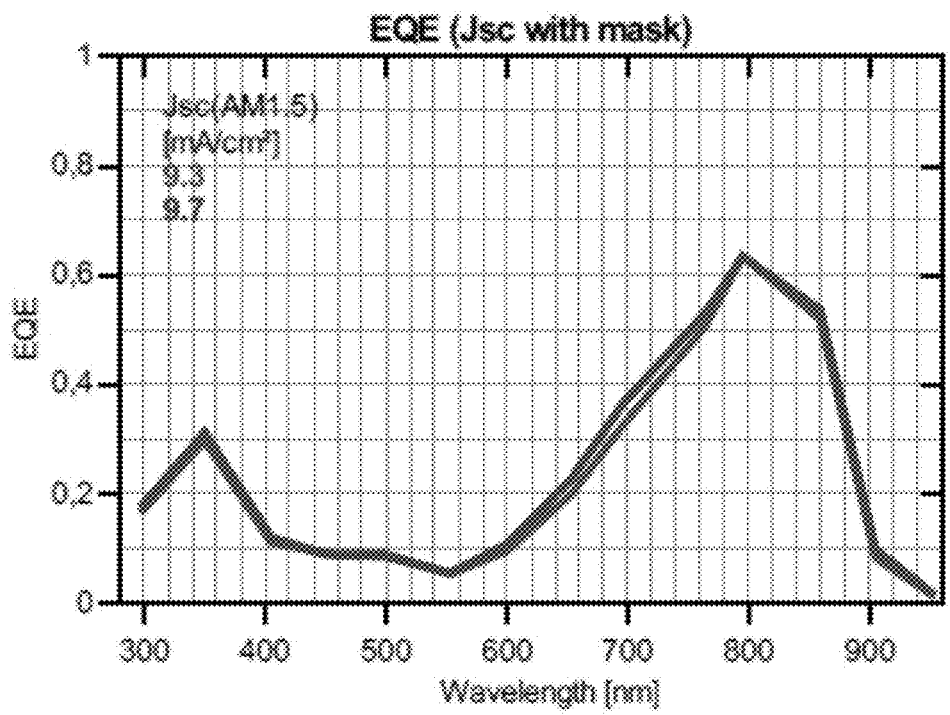

FIG. 5 shows in an embodiment the current-voltage curve with parameters open circuit voltage Voc, short-circuit current Isc, and fill factor FF an optoelectronic element comprising compound G.

Working Examples

FIG. 1 shows in an embodiment a schematic structure of an optoelectronic element.

One possible implementation of an organic solar cell which has already been proposed in the literature is a pin diode which is shown in FIG. 1. In this context n and p are n- or p-doped layers, which lead to an increase in density of free electrons or holes in the thermal equilibrium state, wherein the layers are preferably transport layers. The i-layer (intrinsic layer) refers to an undoped layer comprising at least one compound of the present invention. In one embodiment the i-layer is a mixed layer which results in a donor-acceptor heterojunction.

The optoelectronic element comprises an electrode 2, a counter electrode 6, and a stack 7, wherein the stack 7 is arranged between the electrode 2 and the counter electrode 6, the stack 7 comprises at least one photoactive layer 4 which comprises at least one compound of the present invention, preferably the at least one photoactive layer 4 is a light absorbing layer.

In one working example, the optoelectronic element comprises a glass as substrate 1 with a transparent ITO base contact electrode 2, a layer of fullerene C60 as electron transport layer 3, a neat or a mixed photoactive 4 layer of an inventive compound and fullerene C60, an intrinsic hole transport material in combination with a p-doped hole transport material in layer 5 composed of NDP9 as dopant, and a top contact of Au as counter electrode 6. The neat photoactive layer 4 comprising the inventive compound is deposited at room temperature on the substrate. The mixed photoactive layer 4 comprising the inventive compound and C60 is deposited at a substrate temperature of 50° C. The parameters Voc, Isc and FF refer to a photovoltaic element of the respective donor material of these compounds and fullerene C60 as acceptor material measured under AM1.5 illumination (AM=Air Mass, the global radiation power is 1000 W/m2 as the standard value for measurement of solar cells).

FIG. 2 shows experimental results of absorption spectra of several exemplary compounds of formula (Ia) and/or (Ib) of the present invention.

In the compounds of formula (Ia) and/or formula (Ib),

Ia

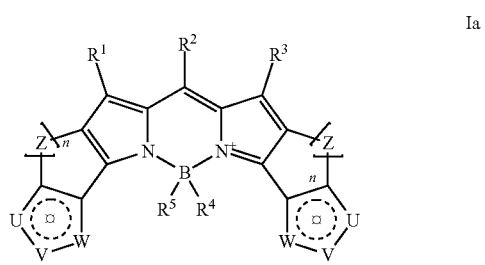

-continued

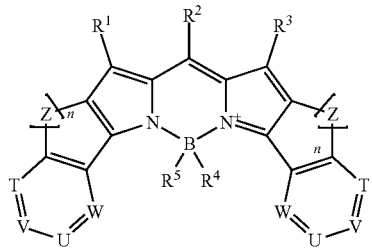

Ib

R1 and R3 are independently selected from H, halogen, alkyl, fluorinated or partly fluorinated alkyl, aryl, and heteroaryl, R2 is selected from halogen, fluorinated and partly fluorinated alkyl, R4 and R5 are independently selected from halogen, alkyl, fluorinated or partly fluorinated alkyl, alkenyl, alkinyl, alkoxy, aryl, and heteroaryl, Z is independently selected from $CH_2$, CHR6 or CR7R8, with R6, R7 and R8 independently selected from H, halogen, alkyl, alkoxy, aryl, and heteroaryl, wherein n is independently 1, 2 or 3, U, V and W of formula (Ia) independently form an aryl ring or a heteroaryl ring having moieties independently selected from the group consisting of CR9, S, O, N or NR10 with R9 and/or R10 independently selected from H, halogen, alkyl, alkoxy, alkthiooxy, aryl, and heteroaryl, and T, U, V and W of formula (Ib) form an aryl ring or a heteroaryl ring having moieties independently selected from the group consisting of CR9, S, O, N and NR10 with R9 and/or R10 independently selected from H, halogen, alkyl, aryl, and heteroaryl.

In an embodiment of the invention R2 is selected from F, $CF_3$, and $C_2F_5$, preferably R2 is $CF_3$, and/or R4 and R5 are independently halogen, preferably F.

In an embodiment of the invention R1 and R3 are independently H or alkyl, preferably R1 and R3 are independently selected from H, methyl, ethyl, and propyl, particularly preferred R1 and R3 are H.

In an embodiment of the invention R9 and/or R10 are independently selected from H, alkyl, aryl, and heteroaryl.

In an embodiment of the invention Z is independently $CH_2$ or CHR6, with R6 independently selected from H, halogen, alkyl, alkoxy, aryl, and heteroaryl, and n is independently 1 or 2, preferably Z is $CH_2$, and n is independently 1 or 2, particularly preferred n is 2.

In an embodiment of the invention the compounds are of formula (Ia),

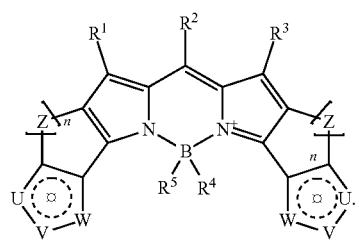

Ia

In an embodiment of the invention the compounds are of formula (Ib),

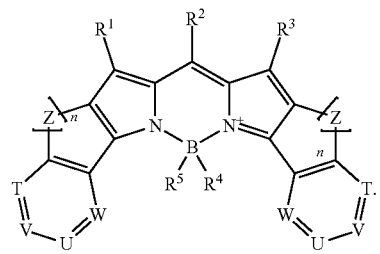

Ib

In an embodiment of the invention T, U, V, W of formula (Ib) independently form an aryl ring, preferably T, U, V, W of formula (Ib) are CH or CR9 with R9 independently selected from H, alkyl, aryl, and heteroaryl, and/or wherein U, V, W of formula (Ia) independently form an heteroaryl ring, preferably at least one of U, V, W of formula (Ia) is S, particularly preferred U and/or W of formula (Ia) are S.

In an embodiment of the invention U and/or V of formula (Ib) are CR9 with R9 independently selected from alkyl, aryl, and heteroaryl, preferably V of formula (Ib) is CR9 with R9 independently selected from alkyl, aryl, and heteroaryl, and/or wherein R9 and/or R10 of formula (Ia) and/or of formula (Ib) are H.

In an embodiment of the invention at least one further five-membered ring and/or six-membered ring, preferably one or two further five-membered rings and/or six-membered rings, is fused to U, V, W of formula (Ia) or to T, U, V, W of formula (Ib), wherein the five-membered rings and/or six-membered rings are preferably substituted and/or non-substituted aryl and/or heteroaryl rings.

In an embodiment of the invention the at least one further five-membered ring, preferably the five-membered aryl and/or heteroaryl ring, does not comprise any further substituent.

In an embodiment of the invention R1 and R3 are no aryl and/or no heteroaryl, and/or wherein R9 and/or R10 are no alkoxy, no aryloxy, and/or no heteroaryloxy.

In an embodiment of the invention the compounds are selected from the group consisting of

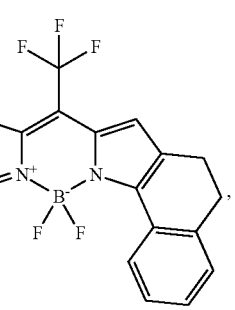

A

-continued

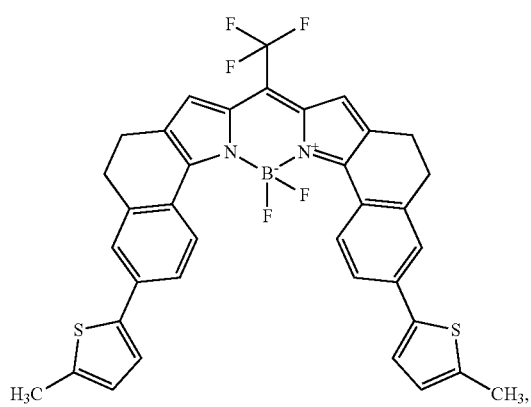
C

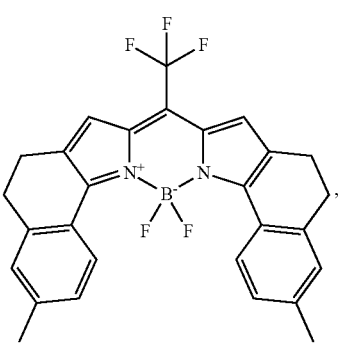
D

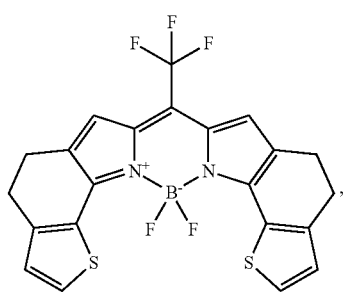
G

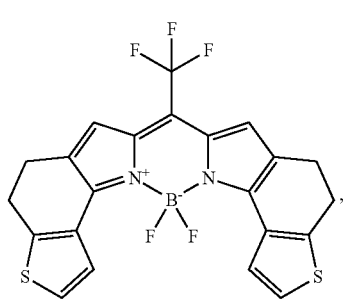
H

-continued

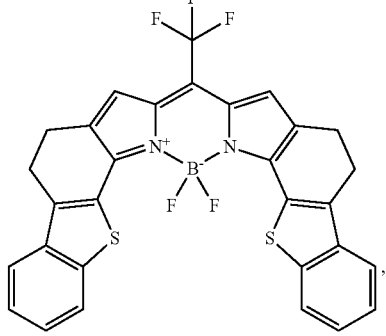
I

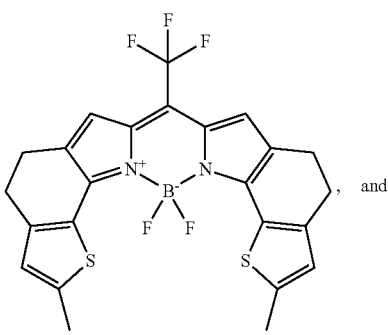
J, and

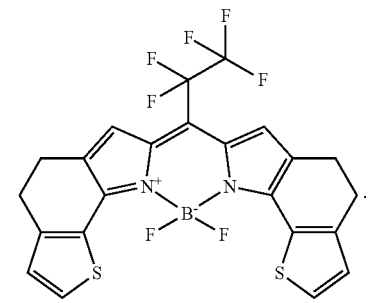
K

In an embodiment of the invention formula (Ia) and/or formula (Ib) are symmetrical towards an axis through B and R2.

FIG. 2 shows experimental results of absorption spectra of several exemplary compounds of formula (Ia) and/or (Ib) of embodiments of the present invention.

Figure 2A:
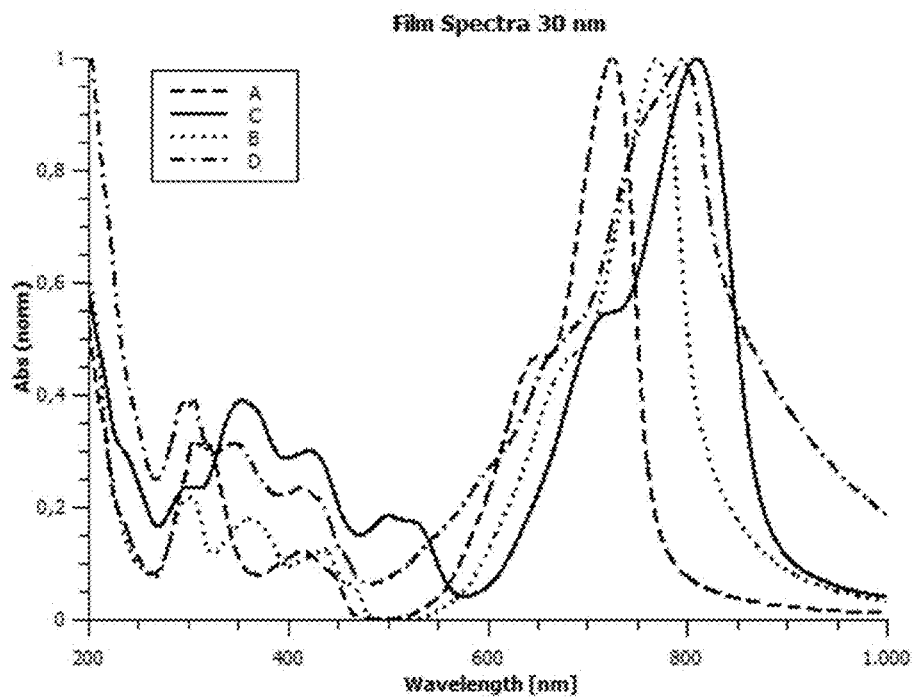
FIGS. 2A-B show experimental results of absorption spectra of several exemplary compounds of formula (Ia) and/or (Ib) of the present invention.
Figure 2B:
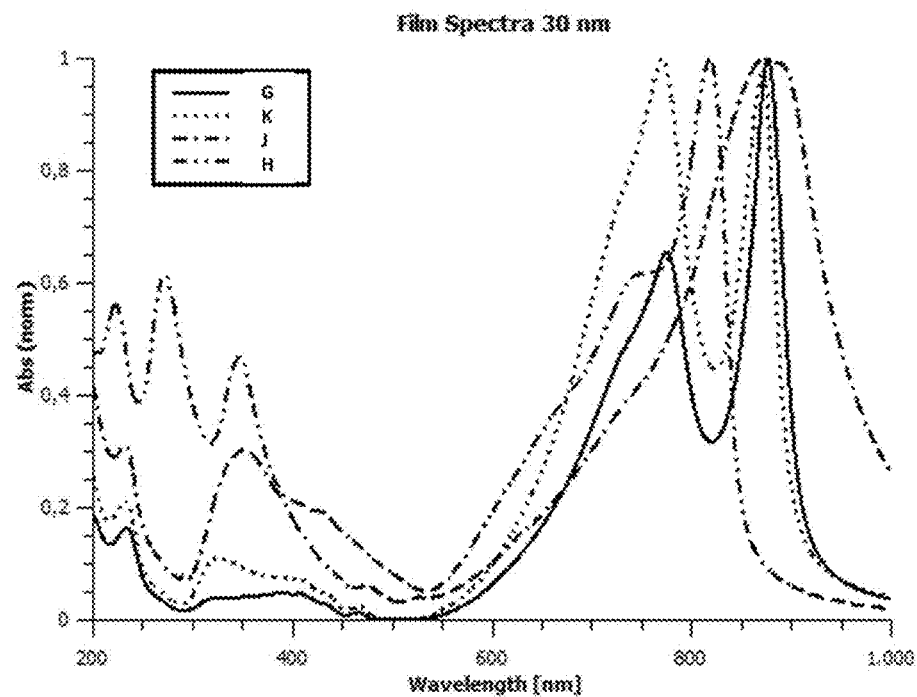

The absorption spectra in thin film of compounds A, B, C, D are shown in FIG. 2A and the absorption spectra in thin film of compounds G, H, J, K are shown in FIG. 2B. The absorption spectra (optical density over wavelength in nm) in thin film were measured for 30 nm vacuum-deposited layers of each compound on quartz-glass.

The following table 1 shows the absorption maxima and the width at half maximum of compounds according to embodiments of the present invention.

Compounds of embodiments of the present invention have high thermal stability and can be evaporated in vacuum. Surprisingly, it has been found that films of the compounds of embodiments of the present invention absorb particularly broadly in the near-infrared region.

The following table shows the absorption maxima in solution and, and the absorption maxima and the half widths of 30 nm thick, vacuum-deposited films of the compounds of embodiments of the present invention. Under half-width, the inventors understand the difference between the two wavelengths for which the absorption maxima have dropped to half of the maximum.

TABLE 1 overview of exemplary compounds and optical properties

| no. | Structure | $\lambda_{max}$ solution/nm | $\lambda_{max}$ film/nm | $\Delta\lambda_{max}$ film-solution/nm | HWB film |
|---|---|---|---|---|---|
| A | | 672 | 723 | 51 | 80 |
| B | | 701 | 768 | 67 | 100 |
| C | | 739 | 808 | 69 | 151 |
| D | | 683 | 796 | 113 | 185 |

TABLE 1-continued overview of exemplary compounds and optical properties

| no. | Structure | $\lambda_{max}$ solution/nm | $\lambda_{max}$ film/nm | $\Delta\lambda_{max}$ film-solution/nm | HWB film |
|---|---|---|---|---|---|
| E | | 717 | 772 | 55 | 124 |
| F | | 708 | 752 | 44 | 86 |
| G | | 718 | 876 | 158 | 46 |
| H | | 682 | 818 | 136 | 121 |

TABLE 1-continued overview of exemplary compounds and optical properties

| no. | Structure | $\lambda_{max}$ solution/nm | $\lambda_{max}$ film/nm | $\Delta\lambda_{max}$ film-solution/nm | HWB film |
|---|---|---|---|---|---|
| I | | 751 | 821 | 70 | 112 |
| J | | 739 | 870 | 131 | 172 |
| K | | 720 | 871 | 151 | 49 |

The maximum of absorption $\lambda_{max}$ in solution of each compound was measured in dichloromethane in a cuvette by photometer. The maximum of absorption of all compounds of Table 1 in solution is in the range from 672 to 751 nm. The maximum of absorption $\lambda_{max}$ of each compound in thin film was measured in an element comprising a 30 nm layer on quartz glass. The maximum of absorption of all compounds of Table 1 in thin film is in the range from 723 to 876 nm. The shift from $\lambda_{max}$ in solution to $\lambda_{max}$ in thin film of all compounds of Table 1 is in the range from 44 to 158 nm. Thus, the compounds of Table 1 show a significant bathochromic shift of the maximum of absorption from solution to thin film. The half-width of the absorption of all compounds of Table 1 is in the range from 46 to 185.

Advantageously the absorption maximum from solution to thin film shows a bathochromic shift. The bathochromic shift from solution is between 44 to 158 nm which is significantly high and resulting in an absorption in the upper near-infrared range.

The optoelectronic element of an embodiment of the present invention comprises two electrodes and between these two electrodes at least one photoactive layer comprising at least one compound of an embodiment of the present invention, preferably the at least one photoactive layer is a light absorbing layer.

In an embodiment of the present invention the compounds are used in an optoelectronic element, preferably in an organic optoelectronic element, particularly preferred in an organic solar cell, an OFET, an OLED, or a photodetector.

Figure 3:
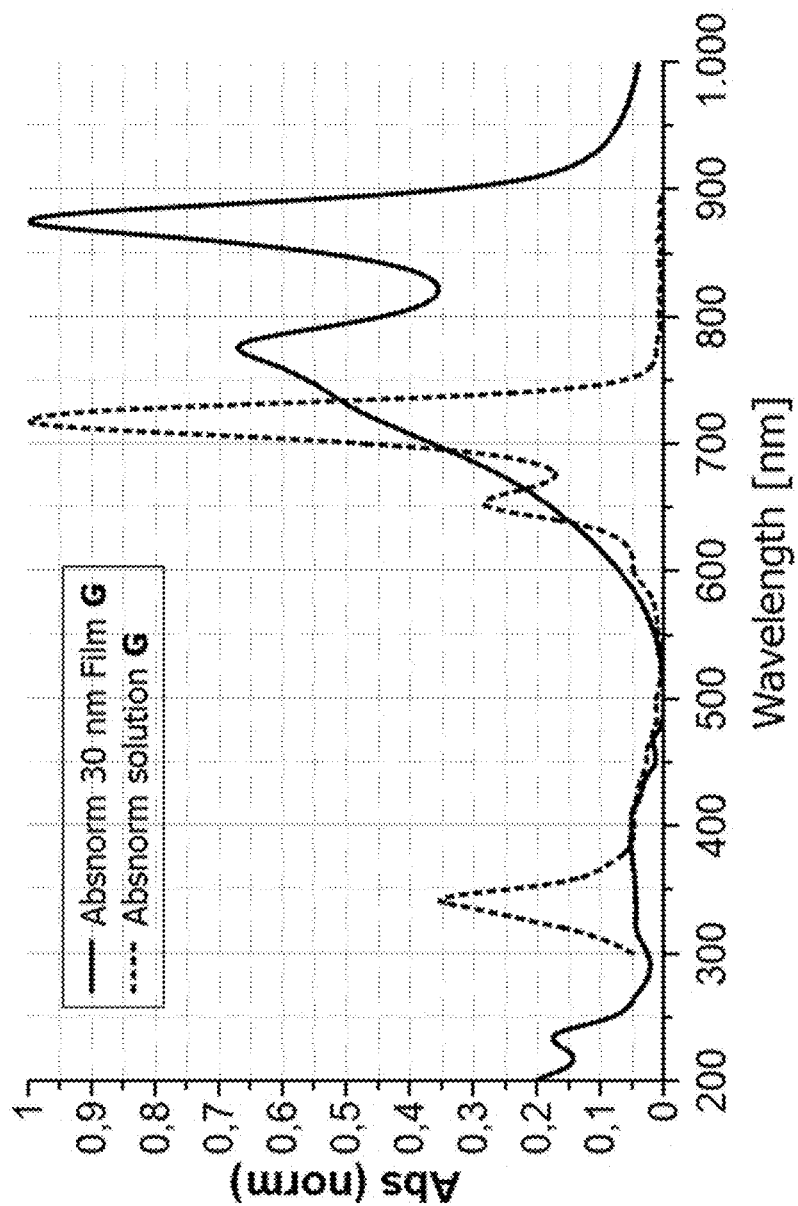
FIG. 3 shows experimental results of absorption spectra of inventive compound G in comparison to non-inventive compound Z.

FIG. 3 shows experimental results of absorption spectra of inventive compound G in comparison to comparative compound Z.

The absorption spectra of inventive compound G in solution and in thin film are compared to the absorption spectra of comparative compound Z. The non-inventive comparative compound is a known and commonly used compound of the group of BODIPYs in optoelectronic components which induces near-infrared (NIR) absorption in the solid state (see Reference 15, biphenyl-fused BODIPY 4):

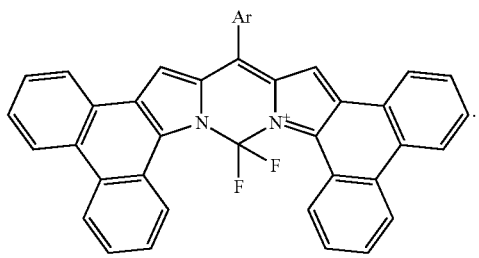

In FIG. 1a of Reference 15 the absorption spectrum of comparative compound Z in Dichloromethane is shown with an intense absorption band at 673 nm, and in FIG. 1c of Reference 15 the absorption spectrum of comparative compound Z in thin film state is shown, which exhibits a red-shift to that in solution of 34 nm. In contrast, compound G shows an absorption maximum of 718 nm in solution and an absorption maximum of 876 nm in thin film resulting in much higher red-shift of absorption, which is a bathochromic shift, from solution to thin film of compound G of 158 nm.

The experimental data demonstrate that the inventive compound G shows improved absorption compared to comparative compound Z. In particular compound G shows stronger absorption from 820 to 890 nm compared to comparative compound Z, which in general results in higher current per area of photoactive layer. Advantageously compounds of embodiments of the present invention show a significant bathochromic shift in absorption of light from solution compared to thin film.

Furthermore, compound G shows a more steep absorption edge in thin film spectra compared to comparative compound Z, which results in reduced loss of open circuit voltage Voc. Due to a more steep absorption edge compounds of embodiments of the present invention are of advantage in tandem- or triple-cells.

Figure 4A:
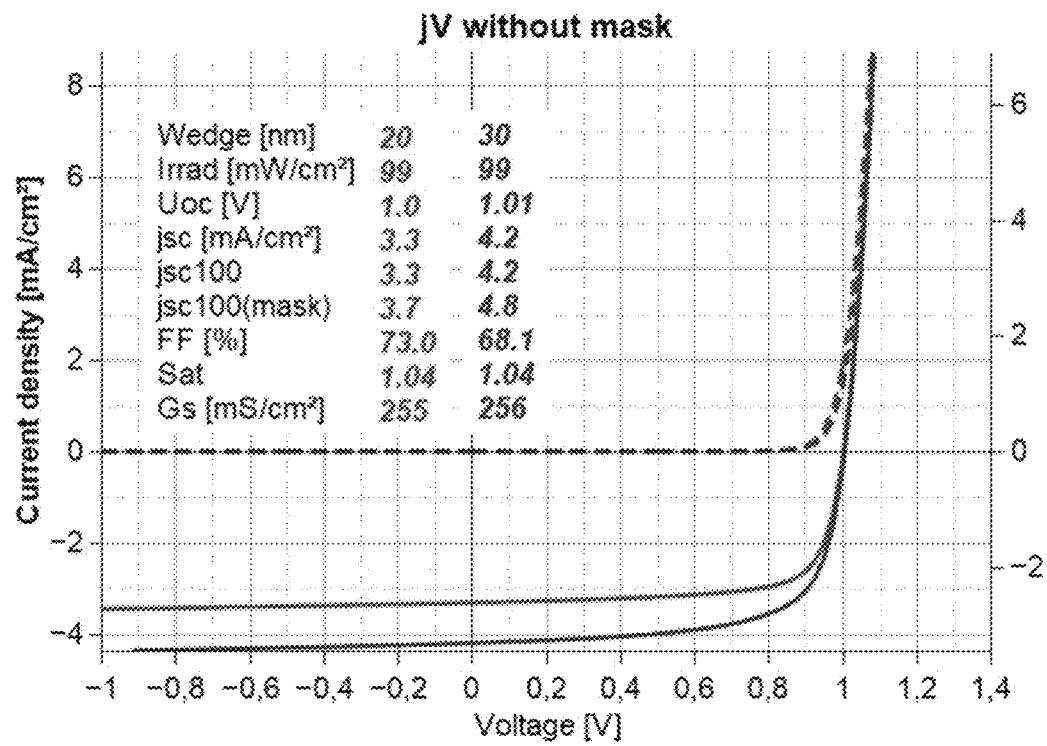
FIGS. 4A-B show in an embodiment the current-voltage curve with parameters open circuit voltage Voc, short-circuit current Isc, and fill factor FF of an optoelectronic element comprising compound A.
Figure 4B:
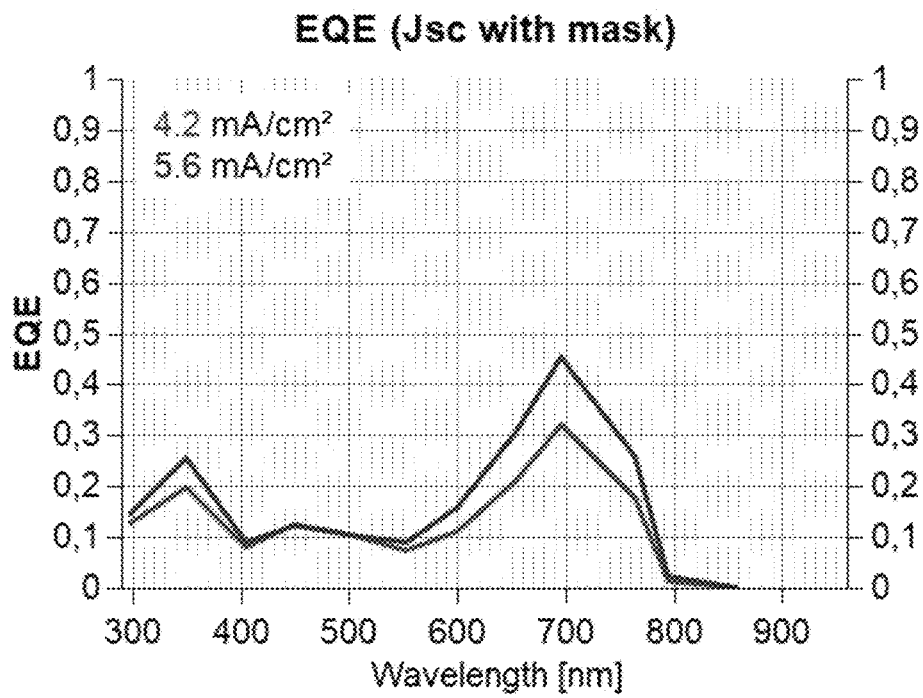

FIG. 4 shows in one embodiment the current-voltage curve with parameters open circuit voltage Voc, short-circuit current Isc, and fill factor FF of an optoelectronic element comprising compound A.

The optoelectronic element in the present embodiment is a photovoltaic element, in particular a solar cell.

The photovoltaic element comprises a substrate 1 (glass), on which an electrode 2 is arranged (ITO), followed by a stack 7 comprising a transport layer 3, one photoactive layer 4 comprising at least one compound of an embodiment of the present invention and fullerene C60, and a further transport layer 5. On the stack a counter electrode 6 (Au) is arranged.

The current-voltage-curve in a BHJ-cell (bulk heterojunction) was measured to obtain the parameters open circuit voltage Voc, short-circuit current Isc, and fill factor FF of the optoelectronic element. The BHJ-cell was constructed as follows:

Glass with ITO/C60 (15 nm)/absorber compound:C60 (20/30 nm, 3:2, 80° C.)/NHT169 (10 nm)/NHT169:NDP9 (45 nm, 10% wt NDP9)/Au (50 nm) under AM1.5 light (AM=air mass; AM=1.5, radiant power 1000 W/m2).

The technical effect of compounds according to an embodiment of the present invention is shown by open circuit voltage Voc, short-circuit current Isc, and the fill factor FF.

The current-voltage curve of a photovoltaic element with a photoactive layer (20 nm) comprising compound A shows an open circuit voltage Voc of 1.0, a short-circuit current Isc of 4.2, and a fill factor FF of 73.0.

Furthermore, compound A shows good evaporability.

FIG. 5 shows in one embodiment the current-voltage curve with parameters open circuit voltage Voc, short-circuit current Isc, and fill factor FF an optoelectronic element comprising compound G.

The optoelectronic element in the present embodiment is a photovoltaic element, in particular a solar cell.

The current-voltage-curve in a PHJ-cell (planar heterojunction) was measured to obtain the parameters open circuit voltage Voc, short-circuit current Isc, and fill factor FF of the optoelectronic element. The PHJ-cell was constructed as follows:

Glass with ITO/C60 (15 nm)/absorber compound (15/20 nm, RT)/HTM081 (10 nm)/HTM081:NDP9 (45 nm, 4% wt NDP9)/Au (50 nm) under AM1.5 light (AM=air mass; AM=1.5, radiant power 1000 W/m2).

The technical effect of compounds according to an embodiment of the present invention is shown by open circuit voltage Voc, short-circuit current Isc, and the fill factor FF.

The current-voltage curve of a photovoltaic element with a photoactive layer (20 nm) comprising compound G shows an open circuit voltage Voc of 0.73, a short-circuit current Isc of 9.7, and a fill factor FF of 67.4.

Furthermore, compound G shows a good evaporability.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

CITATION LIST

Reference 1: WO2004083958A2;
Reference 2: WO2011161108A1;
Reference 3: WO2014128278A1;
Reference 4: DE 199 57 001 A1;
Reference 5: WO2014206860A1;
Reference 6: WO2017114937A1;
Reference 7: WO2017125525A1;

Reference 8: Meshkovaya, V. et al., Photophysical properties of thiophenes and 2,2'-bithiophenes containing alicyclic moieties. Dyes and Pigments. 2015, Vol. 113, pp. 435-446;

Reference 9: Yu, J. et al., A facile and regioselective synthesis of 1-tetralones via silver-catalyzed ring expansion. Org. Biomol. Chem. 2015, Vol. 13, pp. 7924-7927;

Reference 10: Zhao, H. et al., An efficient Synthesis of Enamides from Ketones. Org. Lett. 2008, Vol. 10, No. 3, pp. 505-507;

Reference 11: Kaewchangwat, N. et al., Direct synthesis of aryl substituted pyrroles from calcium carbide: an underestimated chemical feedstock. Green Chem. 2015, Vol. 17, pp. 460-465;

Reference 12: Wang, J. et al., Synthesis, structure and properties of thiophene-fused BODIPYs and aza-BODIPYs as near-infrared agents. New J. Chem. 2016, Vol. 40, pp. 5966-5975;

Reference 13: Shen, Q. et al., Discovery of Potent and Selective Agonists of δ Opioid Receptor by Revisiting the "Message-Address" Concept. ACS Med. Chem. Lett. 2016, Vol. 7, pp 391-396;

Reference 14: Trofimov, B. A. et al., Expedient one-pot synthesis of pyrroles from ketones, hydroxylamine, and 1,2-dichloroethane. Tetrahedron, 2015, Vol. 71, Issue 1, pp. 124-128;

Reference 15: Hayashi et al., Facile Synthesis of Biphenyl-Fused BODIPY and its Property. Organic Letters, 2012, Vol. 14, No. 3, pp. 866-869.

The invention claimed is:

1. Compounds of formula (Ia) and/or formula (Ib),

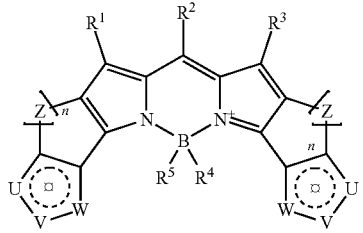

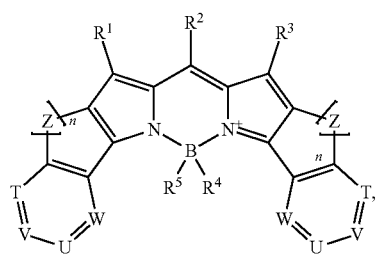

wherein R1 and R3 are independently selected from the group consisting of H, alkyl, and fluorinated or partly fluorinated alkyl, R2 is selected from the group consisting of F, $CF_3$, and $C_2F_5$, R4 and R5 are independently selected from the group consisting of halogen, fluorinated or partly fluorinated alkyl, and alkoxy, Z is independently selected from the group consisting of $CH_2$, CHR6 or CR7R8, with R6, R7 and R8 independently selected from the group consisting of H, halogen, alkyl, alkoxy, aryl, and heteroaryl, wherein n is independently 1 or, 2, or 3, U, V and W of formula (Ia) independently form an aryl ring or a heteroaryl ring having moieties independently selected from the group consisting of CR9, S, O, N or NR10 with R9 and/or R10 independently selected from the group consisting of H, halogen, alkyl, alkoxy, alkthiooxy, aryl, and heteroaryl, and T, U, V and W of formula (Ib) form an aryl ring or a heteroaryl ring having moieties independently selected from the group consisting of CR9, S, O, N and NR10 with R9 and/or R10 independently selected from the group consisting of H, halogen, alkyl, aryl, and heteroaryl.

2. The compounds according to claim 1, wherein R4 and R5 are independently halogen.

3. The compounds according to claim 1, wherein R1 and R3 are independently H or alkyl.

4. The compounds according to claim 1 wherein R9 and/or R10 are independently selected from the group consisting of H, alkyl, aryl, and heteroaryl.

5. The compounds according to claim 1, wherein Z is independently $CH_2$ or CHR6, with R6 independently selected from the group consisting of H, halogen, alkyl, alkoxy, aryl, and heteroaryl.

6. The compounds according to claim 1, wherein the compounds are of formula (Ia),

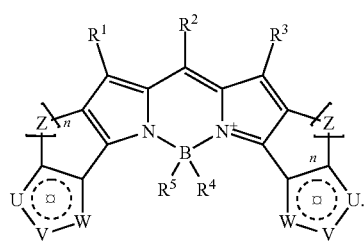

7. The compounds according to claim 1, wherein the compounds are of formula (Ib),

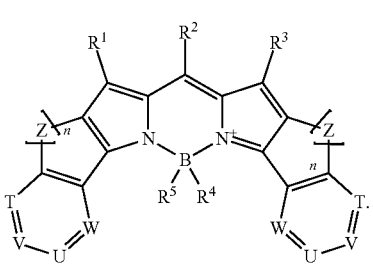

8. The compounds according to claim 1, wherein T, U, V, W of formula (Ib) independently form an aryl ring, and/or wherein U, V, W of formula (Ia) independently form an heteroaryl ring.

9. The compounds according to claim 1, wherein U and/or V of formula (Ib) are CR9 with R9 independently selected from the group consisting of alkyl, aryl, and heteroaryl, and/or wherein R9 and/or R10 of formula (Ia) and/or of formula (Ib) are H.

10. The compounds according to claim 1, wherein at least one further five-membered ring and/or six-membered ring, is fused to U, V, W of formula (Ia) or to T, U, V, W of formula (Ib), wherein the five-membered rings and/or six-membered rings are substituted and/or non-substituted aryl and/or heteroaryl rings.

11. The compounds according to claim 1 wherein the compounds are free of aryl and heteroaryl groups at R1 and R3, and/or wherein the compounds are free of alkoxy, aryloxy, and heteroaryloxy at R9 and.

12. The compounds according to claim 1, wherein the compounds are selected from the group consisting of

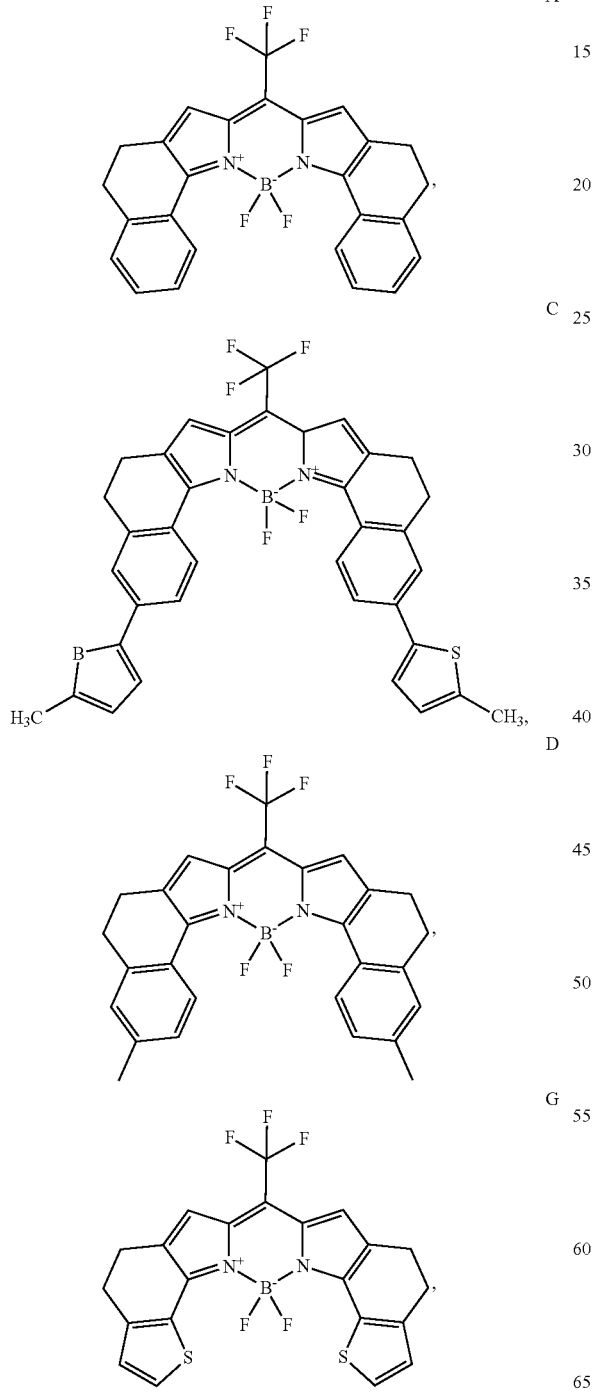

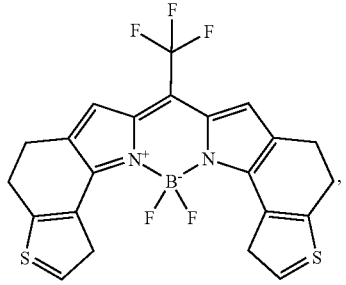

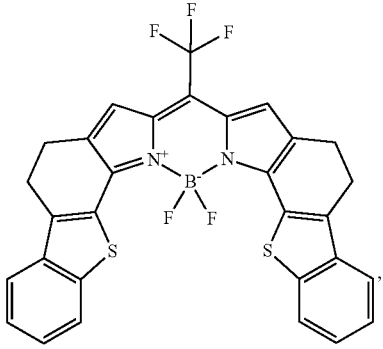

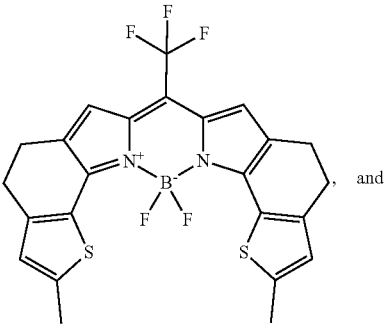

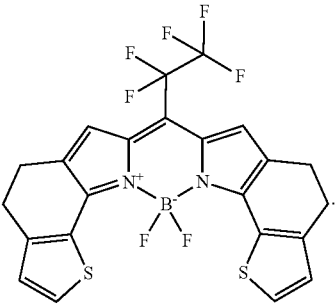

13. The compounds according to claim 1, wherein formula (Ia) and/or formula (Ib) are symmetrical over an axis through B and R2.

14. An optoelectronic element, wherein the optoelectronic element comprises two electrodes and at least one photoactive layer between the two electrodes, the at least one photoactive layer comprising at least one compound according to claim 1.

15. An optoelectronic element comprising the compounds according to claim 1 in an optoelectronic element.

* * * * *